(12) United States Patent
Shin et al.

(10) Patent No.: US 10,993,337 B2
(45) Date of Patent: Apr. 27, 2021

(54) DISPLAY DEVICE

(71) Applicant: LG Display Co., Ltd., Seoul (KR)

(72) Inventors: Mi-Na Shin, Paju-si (KR); ChounSung Kang, Gimpo-si (KR); SunBok Song, Paju-si (KR); GeunChang Park, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/674,563

(22) Filed: Nov. 5, 2019

(65) Prior Publication Data

US 2020/0154580 A1 May 14, 2020

(30) Foreign Application Priority Data

Nov. 8, 2018 (KR) .................. 10-2018-0136876

(51) Int. Cl.
| | |
|---|---|
| *H05K 5/00* | (2006.01) |
| *H05K 5/02* | (2006.01) |
| *H05K 1/14* | (2006.01) |
| *H05K 1/18* | (2006.01) |

(52) U.S. Cl.
CPC ........... *H05K 5/0017* (2013.01); *H05K 1/147* (2013.01); *H05K 1/189* (2013.01); *H05K 5/0217* (2013.01); *H05K 2201/10128* (2013.01)

(58) Field of Classification Search
CPC .................................................. H05K 5/0017
USPC ....................................................... 361/749
See application file for complete search history.

(56) References Cited

U.S. PATENT DOCUMENTS

| | | | |
|---|---|---|---|
| 9,684,340 B2* | 6/2017 | Han | G09G 3/3233 |
| 9,730,318 B2 | 8/2017 | Choi et al. | |
| 9,743,537 B2 | 8/2017 | Kim et al. | |
| 9,870,029 B2* | 1/2018 | Kim | G06F 1/1652 |
| 10,045,448 B2 | 8/2018 | Yang | |
| 10,162,255 B2* | 12/2018 | Kasahara | G03B 21/58 |
| 10,186,681 B2* | 1/2019 | Kang | H01L 51/5237 |
| 10,263,216 B2* | 4/2019 | Koo | G02F 1/133345 |
| 10,617,017 B2 | 4/2020 | Park et al. | |
| 10,845,696 B2* | 11/2020 | Song | H04N 9/3173 |
| 2005/0040962 A1* | 2/2005 | Funkhouser | G06F 1/1615 |
| | | | 340/815.4 |
| 2015/0227171 A1* | 8/2015 | Choi | G06F 1/1652 |
| | | | 361/749 |

(Continued)

FOREIGN PATENT DOCUMENTS

| | | |
|---|---|---|
| JP | 2016-085454 A | 5/2016 |
| JP | 2016-130853 A | 7/2016 |

(Continued)

OTHER PUBLICATIONS

Notice of Reasons for Refusal dated Nov. 25, 2020 from the Japanese Patent Office concerning a counterpart Japanese Patent Application No. 2019-192916.

*Primary Examiner* — Stanley Tso

(74) *Attorney, Agent, or Firm* — Morgan, Lewis & Bockius LLP

(57) ABSTRACT

A disclosed display apparatus may include a display panel configured to display an image, and a first back cover at a rear surface of the display panel and supporting the display panel. The display apparatus may additionally include a roller configured to wind or unwind the display panel, and an adhesive part between the display panel and the first back cover and fixed to the roller.

23 Claims, 16 Drawing Sheets

(56) References Cited

U.S. PATENT DOCUMENTS

| | | | |
|---|---|---|---|
| 2016/0029474 A1* | 1/2016 | Cho | H05K 5/0217 |
| | | | 361/749 |
| 2016/0120023 A1 | 4/2016 | Choi et al. | |
| 2016/0202729 A1* | 7/2016 | Lee | G06F 1/1652 |
| | | | 361/750 |
| 2016/0202781 A1* | 7/2016 | Kim | G06F 1/1643 |
| | | | 345/173 |
| 2016/0205791 A1 | 7/2016 | Kim et al. | |
| 2016/0255713 A1* | 9/2016 | Kim | G02F 1/133305 |
| | | | 361/749 |
| 2017/0311461 A1 | 10/2017 | Yang | |
| 2017/0367198 A1* | 12/2017 | Park | H01L 51/5237 |
| 2018/0103551 A1 | 4/2018 | Park | |
| 2018/0153038 A1 | 5/2018 | Kim | |

FOREIGN PATENT DOCUMENTS

| | | | |
|---|---|---|---|
| JP | 2017-227863 A | 12/2017 | |
| JP | 2017-536573 A | 12/2017 | |
| JP | 2018-168611 A | 11/2018 | |
| KR | 10-2016-0127220 A | 11/2016 | |
| KR | 10-2018-0062269 A | 6/2018 | |

\* cited by examiner

DISPLAY DEVICE

CROSS-REFERENCE TO RELATED APPLICATIONS

This application claims the benefit and priority of Korean Patent Application No. 10-2018-0136876 filed on Nov. 8, 2018 in the Korean Intellectual Property Office, the disclosure of which is incorporated herein by reference as if fully set forth herein.

BACKGROUND

1. Technical Field

The present disclosure relates to a display device, and more particularly, to a rollable display device that can be manufactured to a large size with improved reliability.

2. Description of the Related Art

Display devices used for a computer monitor, a TV, a mobile phone, and other applications include, among others, an organic light-emitting display (OLED) that emits light by itself and a liquid-crystal display (LCD) that requires a separate light source.

As display devices are applied to increasingly diverse fields, such as a computer monitor, a TV, and a personal mobile device, display devices having a large display area and a reduced volume and weight have been studied.

Recently, a rollable display device in which a display part and wiring lines are formed on a flexible substrate made of flexible plastic and which can display an image even in a rolled state has attracted attention as a next-generation display device.

SUMMARY

Accordingly, embodiments of the present disclosure are directed to a display device that substantially obviates one or more of the problems due to limitations and disadvantages of the related art.

An object of the present disclosure is to provide a display device having a large size by using a plurality of back covers.

Another object of the present disclosure is to provide a display device in which a back cover is not disposed where a large amount of stress may be applied during winding to suppress or minimize potential tear or deformation of the back cover that may be caused by the shape of a roller.

Yet another object of the present disclosure is to provide a display device in which a roller may be fixed to an adhesive part to simplify a manufacturing process of the display device.

Objects of the present disclosure are not limited to the examples noted above, and other objects may be apparent to or understood by those skilled in the art from the present disclosure, including the detailed description and drawings.

To achieve these and other advantages and in accordance with the purpose of the present disclosure, as embodied and broadly described, a display apparatus may include: a display panel configured to display an image; a first back cover at a rear surface of the display panel and supporting the display panel; a roller configured to wind or unwind the display panel; and an adhesive part between the display panel and the first back cover, and fixed to the roller.

According to another aspect of the present disclosure, a display apparatus may include: a display panel configured to display an image; a first back cover at a rear surface of the display panel and supporting the display panel; a second back cover spaced apart from the first back cover; an adhesive part connected between the display panel and the first back cover, and connected to the second back cover; and a roller connected to the second back cover, and configured to wind or unwind at least one of the adhesive part, the display panel, and the first back cover.

Other details of example embodiments are included in the detailed description and the drawings.

According to the present disclosure, a back cover may comprise a first back cover and a second back cover spaced apart from each other. Thus, even when a display panel is increased in size, the back cover can also be increased in size accordingly.

According to the present disclosure, it is possible to minimize or suppress potential damages to a back cover and a display panel that may be caused by a roller during winding or unwinding of a display device.

The potential benefits and advantages according to the present disclosure are not limited to the examples listed above, and various additional benefits and advantages may be discussed in or apparent from the present disclosure.

It is to be understood that both the foregoing general description and the following detailed description of the present disclosure are exemplary and explanatory, and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1A:
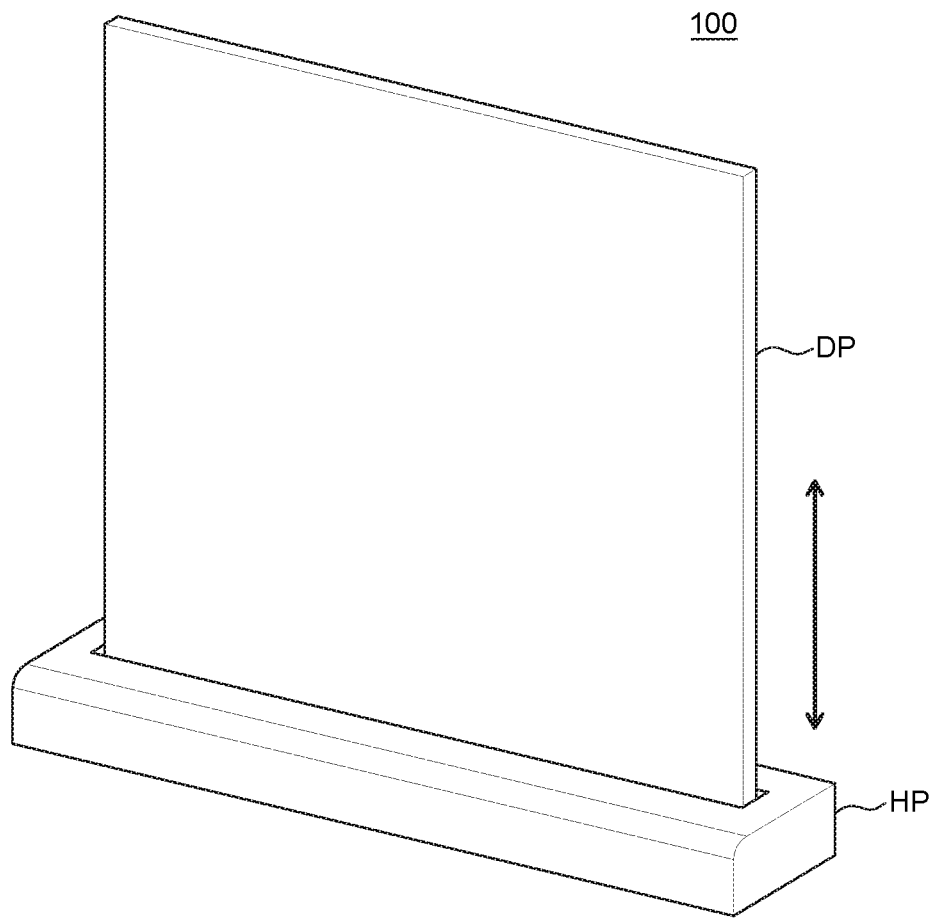
FIG. 1A and FIG. 1B are perspective views of a display device according to an example embodiment of the present disclosure.

Reference will now be made in detail to embodiments of the present disclosure, examples of which are illustrated in the accompanying drawings.

Advantages and features of the present disclosure, and implementation methods thereof will be clarified through the following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

A shape, a size, a ratio, an angle, and a number disclosed in the drawings for describing embodiments of the present disclosure are merely an example. Thus, the present disclosure is not limited to the illustrated details. Unless otherwise described, like reference numerals refer to like elements throughout. In the following description, when the detailed description of the relevant known function or configuration is determined to obscure an important point of the present disclosure unnecessarily, the detailed description of such known function or configuration may be omitted. In a case where terms "comprise," "have," and "include" described in the present specification are used, another part may be added unless a more limiting term, such as "only," is used. The terms of a singular form may include plural forms, and vice versa, unless referred to the contrary.

In construing an element, the element is construed as including an error or tolerance range even where no explicit description of such an error or tolerance range is provided.

In describing a position relationship, when a position relation between two parts is described as, for example, "on," "over," "under," or "next," one or more other parts may be disposed between the two parts unless a more limiting term, such as "immediate(ly)" or "direct(ly)," is used. For example, when an element or layer is disposed "on" another element or layer, a third layer or element may be interposed therebetween.

Although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

A size and a thickness of each component illustrated in the drawings are illustrated for convenience of description, and the present disclosure is not limited to the size and the thickness of the component illustrated, unless otherwise stated.

Features of various embodiments of the present disclosure may be partially or overall coupled to or combined with each other, and may be variously inter-operated with each other and driven technically, as those skilled in the art can sufficiently understand. Embodiments of the present disclosure may be carried out independently from each other, or may be carried out in association with each other.

Hereinafter, a display device according to example embodiments of the present disclosure will be described in detail with reference to accompanying drawings.

<Display Device-Rollable Display Device>

A rollable display device may refer to a display device which can display an image even in a rolled state. The rollable display device may have higher flexibility than conventional typical display devices. Depending on whether the rollable display device is in use, a shape of the rollable display device may be freely varied. Specifically, when the rollable display device is not in use, the rollable display device may be rolled to be stored with a reduced volume. On the other hand, when the rollable display device is in use, the rolled rollable display device may be unrolled to be used, e.g., to display images.

Figure 1B:
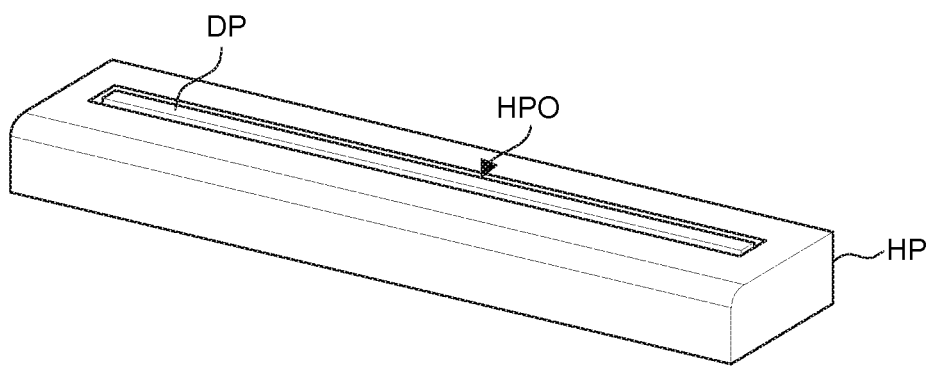

FIG. 1A and FIG. 1B are perspective views of a display device according to an example embodiment of the present disclosure. As shown in FIG. 1A and FIG. 1B, a display device 100 according to an example embodiment of the present disclosure includes a display part DP and a housing part HP.

The display part DP is configured to display images to a user. For example, display elements, circuits for driving the display elements, lines, and other components may be disposed in the display part DP. The display device 100 here according to an example embodiment of the present disclosure is a rollable display device 100. Therefore, the display part DP may be configured to be wound and unwound. For example, the display part DP may include a display panel and a back cover which are flexible so as to be capable of being wound or unwound. The display part DP will be described below in more detail with reference to FIGS. 5 through 7.

The housing part HP serves as a case where the display part DP can be housed. The display part DP may be wound and then housed inside the housing part HP, for example, as shown in FIG. 1B. Also, the display part DP may be unwound and then presented outside the housing part HP, for example, as shown in FIG. 1A.

The housing part HP may include an opening HPO through which the display part DP can move in and out of the housing part HP. The display part DP can move up and down through the opening HPO of the housing part HP.

The display part DP of the display device 100 may be converted from a fully unwound state to a fully wound state, and vice versa.

FIG. 1A shows a fully unwound state of the display part DP of the display device 100. The fully unwound state refers to a state in which the display part DP of the display device 100 is fully presented outside the housing part HP. That is, the fully unwound state can be viewed as a state in which the display part DP is unwound to a maximum extent so as not to be further unwound and is presented outside the housing part HP in order for the user to watch images on the display device 100.

FIG. 1B shows a fully wound state of the display part DP of the display device 100. The fully wound state refers to a state in which the display part DP of the display device 100 is fully housed inside the housing part HP so as not to be further wound. That is, the fully wound state may be viewed as a state in which the display part DP is wound and housed inside the housing part HP. When the user is not watching images on the display device 100, it is preferable for the sake of external appearance to have the display part DP housed inside the housing part HP. Further, in the fully wound state in which the display part DP is housed inside the housing part HP, the display device 100 is reduced in volume and easy to transport.

A moving part for winding or unwinding the display part DP to change the display part DP between the fully unwound state and the fully wound state is provided in an example embodiment.

<Moving Part>

Figure 2:
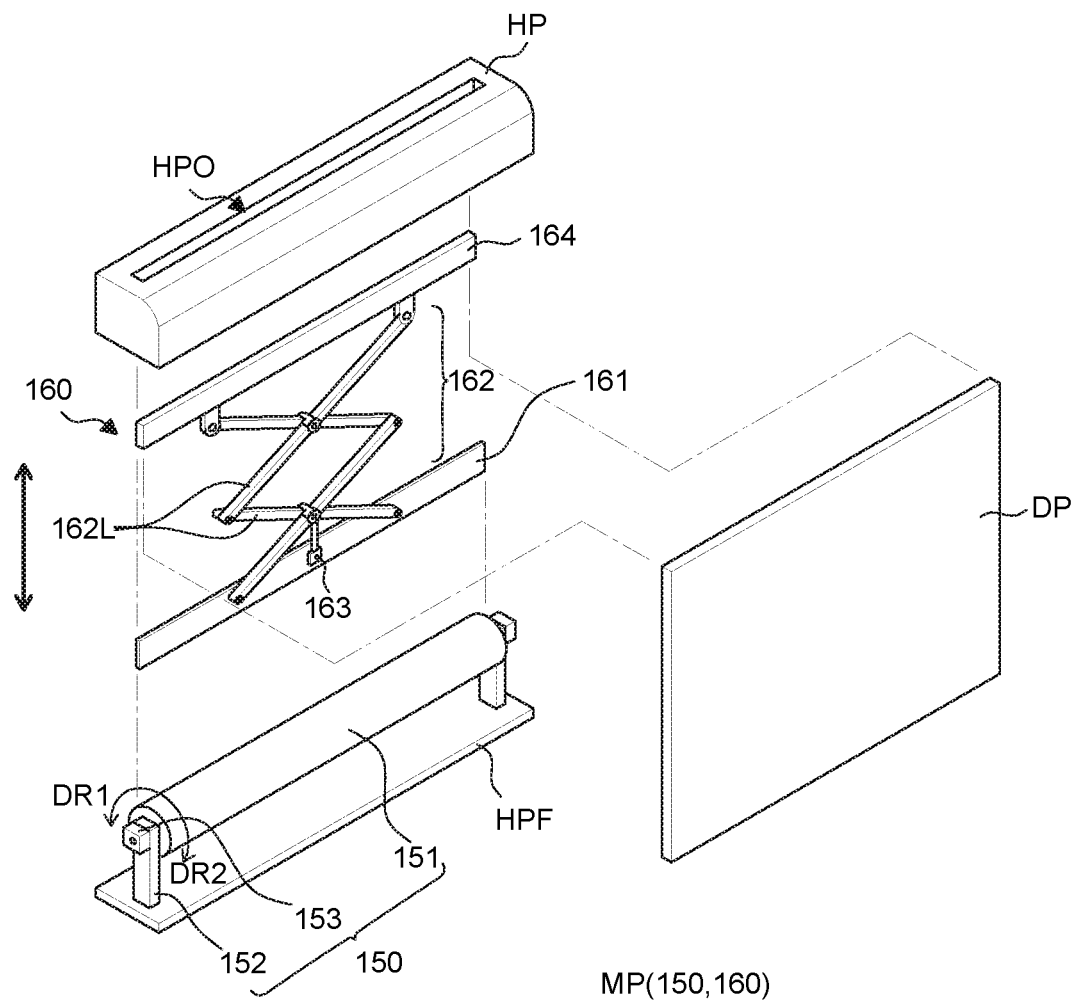
FIG. 2 is an exploded perspective view of the display device according to an example embodiment of the present disclosure.
Figure 3:
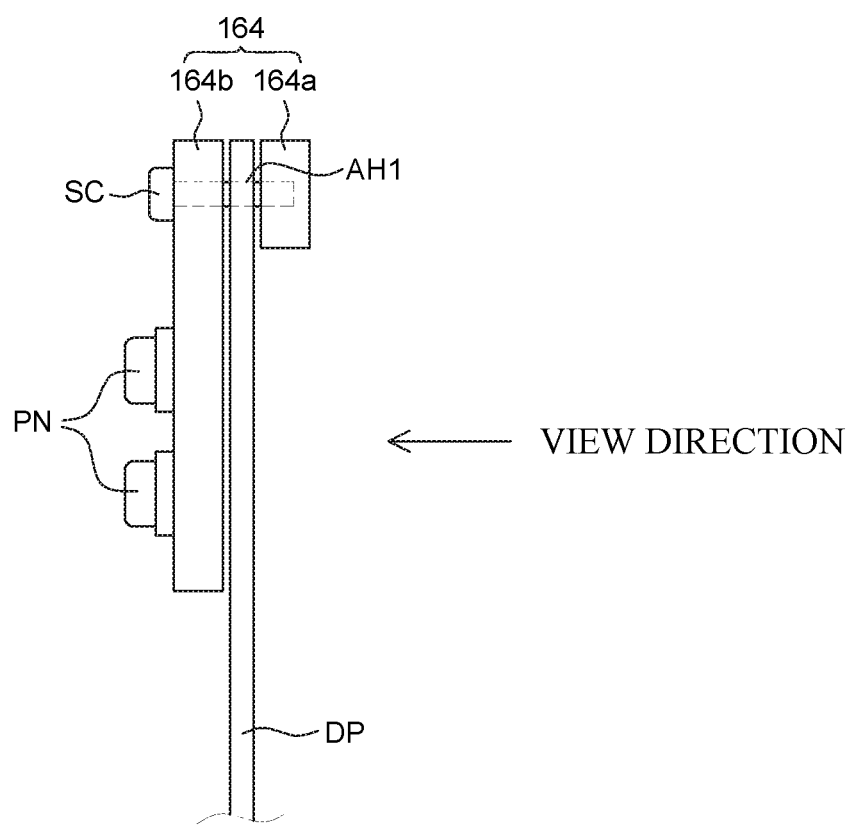
FIG. 3 is a schematic cross-sectional view provided to explain a head bar and a display part of the display device according to an example embodiment of the present disclosure.
Figure 4:
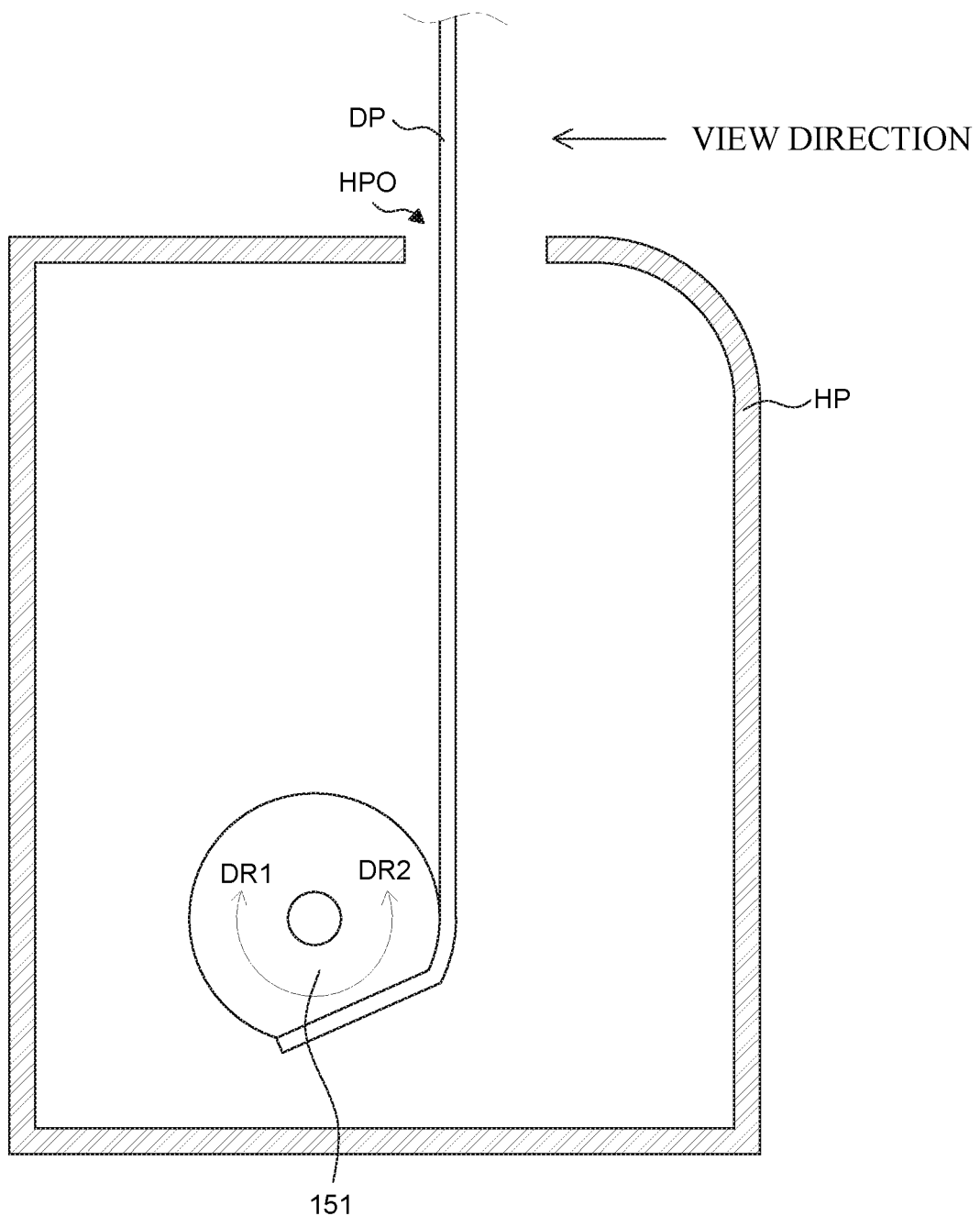
FIG. 4 is a cross-sectional view of the display device according to an example embodiment of the present disclosure.

FIG. 2 is an exploded perspective view of the display device according to an example embodiment of the present disclosure. FIG. 3 is a schematic cross-sectional view provided to explain a head bar and a display part of the display device according to an example embodiment of the present disclosure. FIG. 4 is a cross-sectional view of the display device according to an example embodiment of the present disclosure. FIG. 4 is a schematic cross-sectional view provided to explain a roller 151 and the display part DP of the display device 100 according to an example embodiment of the present disclosure. For convenience of description, FIG. 3 illustrates only a head bar 164 and the display part DP, and FIG. 4 illustrates only the housing part HP, the roller 151, and the display part DP.

First, as illustrated in FIG. 2, a moving part MP may include a roller unit 150 and an elevating unit 160.

The roller unit 150 may wind or unwind the display part DP fixed to the roller unit 150 while rotating in a first direction DR1 or a second direction DR2. The roller unit 150 may include the roller 151, a roller supporting unit 152, and a roller rotating unit 153.

The roller 151 is a member around which the display part DP may be wound. The roller 151 may have, e.g., a cylindrical shape. The lower edge of the display part DP may be fixed to the roller 151. When the roller 151 rotates, the display part DP whose lower edge is fixed to the roller 151 may be wound around the roller 151. On the other hand, when the roller 151 rotates in the opposite direction, the display part DP wound around the roller 151 may be unwound from the roller 151.

As shown in FIG. 4, the roller 151 may have a cylindrical shape overall but may be partially flat. That is, a part of the outer peripheral surface of the roller 151 may be flat, and the other part of the outer peripheral surface may be curved. However, the present disclosure is not limited thereto. The roller 151 may have a completely cylindrical shape or may have any shape around which the display part DP can be wound, but is not limited thereto.

The roller supporting units 152 may support the roller 151 from both sides of the roller 151. Specifically, the roller supporting units 152 may be disposed on a bottom surface HPF of the housing part HP. Further, upper side surfaces of the respective roller supporting units 152 may be combined with respective ends of the roller 151. Thus, the roller supporting units 152 may support the roller 151 to be spaced apart from the bottom surface HPF of the housing part HP. Here, the roller 151 may be rotatably combined with the roller supporting unit 152.

The roller rotating unit 153 may rotate the roller 151 in the first direction DR1 or the second direction DR2. The roller rotating unit 153 may be disposed on one or each of the pair of roller supporting units 152. For example, the roller rotating unit 153 may be a rotary motor that transfers rotatory power to the roller 151, but is not limited thereto.

The elevating unit 160 may move the display part DP up and down according to driving of the roller unit 150. The elevating unit 160 may include a link supporting unit 161, a link unit 162, a link elevating unit 163, and the head bar 164.

The link supporting unit 161 may support the link unit 162 and the link elevating unit 163. Specifically, the link supporting unit 161 may support the link unit 162 and the display part DP which may move up and down so as not to collide with the boundary of the opening HPO of the housing part HP. The link supporting unit 161 may support the link unit 162 and the display part DP to be movable only up and down but not forward and backward.

The link unit 162 may include a plurality of links 162L hinged to each other. The plurality of links 162L may be rotatably hinged to each other and can be moved up and down by the link elevating unit 163. When the link unit 162 moves up and down, the plurality of links 162L may rotate in a direction to be farther from or closer to each other. More details thereof will be described below with reference to FIG. 4.

The link elevating unit 163 may move the link unit 162 up and down. The link elevating unit 163 may rotate the plurality of links 162L of the link unit 162 to be closer to or farther away from each other. The link elevating unit 163 may move the link unit 162 up or down to move the display part DP connected to the link unit 162 up or down.

Here, driving of the link elevating unit 163 may be synchronized with driving of the roller rotating unit 153. Thus, the roller unit 150 and the elevating unit 160 may be driven at the same time. For example, when the display part DP is switched from the fully unwound state to the fully wound state, the roller unit 150 may be driven to wind the display part DP around the roller 151. At the same time, the elevating unit 160 may rotate the plurality of links 162L of the link unit 162 to move the display part DP down. Further, when the display part DP is switched from the fully wound state to the fully unwound state, the roller unit 150 may be driven to unwind the display part DP from the roller 151. At the same time, the elevating unit 160 may rotate the plurality of links 162L of the link unit 162 to move the display part DP up.

The head bar 164 of the elevating unit 160 may be fixed to the uppermost end of the display part DP. The head bar 164 may be connected to the link unit 162 and may move the display part DP up and down according to a rotation of the plurality of links 162L of the link unit 162. That is, the display part DP can be moved up and down by the head bar 164, the link unit 162, and the link elevating unit 163.

As illustrated in FIG. 3, the head bar 164 may be disposed on the uppermost end of the display part DP to cover a portion of a front surface and a portion of a rear surface of the display part DP.

The head bar 164 may include a first head bar 164a and a second head bar 164b. The first head bar 164a may cover a front surface of the display part DP. The first head bar 164a may cover only a part of the front surface of the display part DP adjacent to the uppermost edge of the display part DP in order not to cover images displayed on the front surface of the display part DP.

The second head bar 164b may cover a portion of a rear surface of the display part DP. The second head bar 164b may cover only a part of the rear surface of the display part DP adjacent to the uppermost edge of the display part DP. Since images are not displayed on the rear surface of the display part DP, the second head bar 164b may overlap a larger portion of the display part DP than the first head bar 164a.

To fasten the display part DP to the first head bar 164a and the second head bar 164b, first fastening holes AH1 may be formed in the display part DP. Further, screws SC may penetrate the first fastening holes AH1 to fasten the first head bar 164a, the display part DP, and the second head bar 164b together.

The second head bar 164b may include pem nuts PN to which the link unit 162 of the elevating unit 160 may be fastened. The second head bar 164b and link unit 162 of the elevating unit 160 may be fastened to each other by the pem nuts PN. Therefore, when the link unit 162 of the elevating unit 160 moves up and down, the second head bar 164b fastened to the link unit 162 and the first head bar 164a, and the display part DP fastened to the second head bar 164b may move up and down together.

FIG. 3 illustrates an example in which the first head bar 164a and the second head bar 164b have a straight line shape. However, the first head bar 164a and the second head bar 164b may have various other shapes. The shapes of the first head bar 164a and the second head bar 164b are not limited to the example illustrated in FIG. 3. For example, the first head bar 164a and the second head bar 164b may have an inverted "L" shape.

Hereafter, an operation of the moving part MP will be described in detail with reference to FIG. 4.

As shown in FIG. 4, the lower edge of the display part DP may be connected to the roller 151. Further, when the roller 151 is rotated by the roller rotating unit 153 (see FIG. 2) in the first direction DR1, i.e., in a clockwise direction, the display part DP may be wound around the roller 151 so that the rear surface of the display part DP can be in close contact with a surface of the roller 151.

On the other hand, when the roller 151 is rotated by the roller rotating unit 153 in the second direction DR2, i.e., in a counterclockwise direction, the display part DP wound around the roller 151 may be unwound from the roller 151 and then presented outside the housing part HP.

In some example embodiments, the moving part MP different in structure from the above-described example moving part MP may be employed in the display device 100. That is, the roller unit 150 and the elevating unit 160 may be changed in configuration as long as the display part DP can be wound and unwound. Some of their components may be omitted or modified, or other components may be added.

<Detailed Configuration of an Example Display Device>

Figure 5:
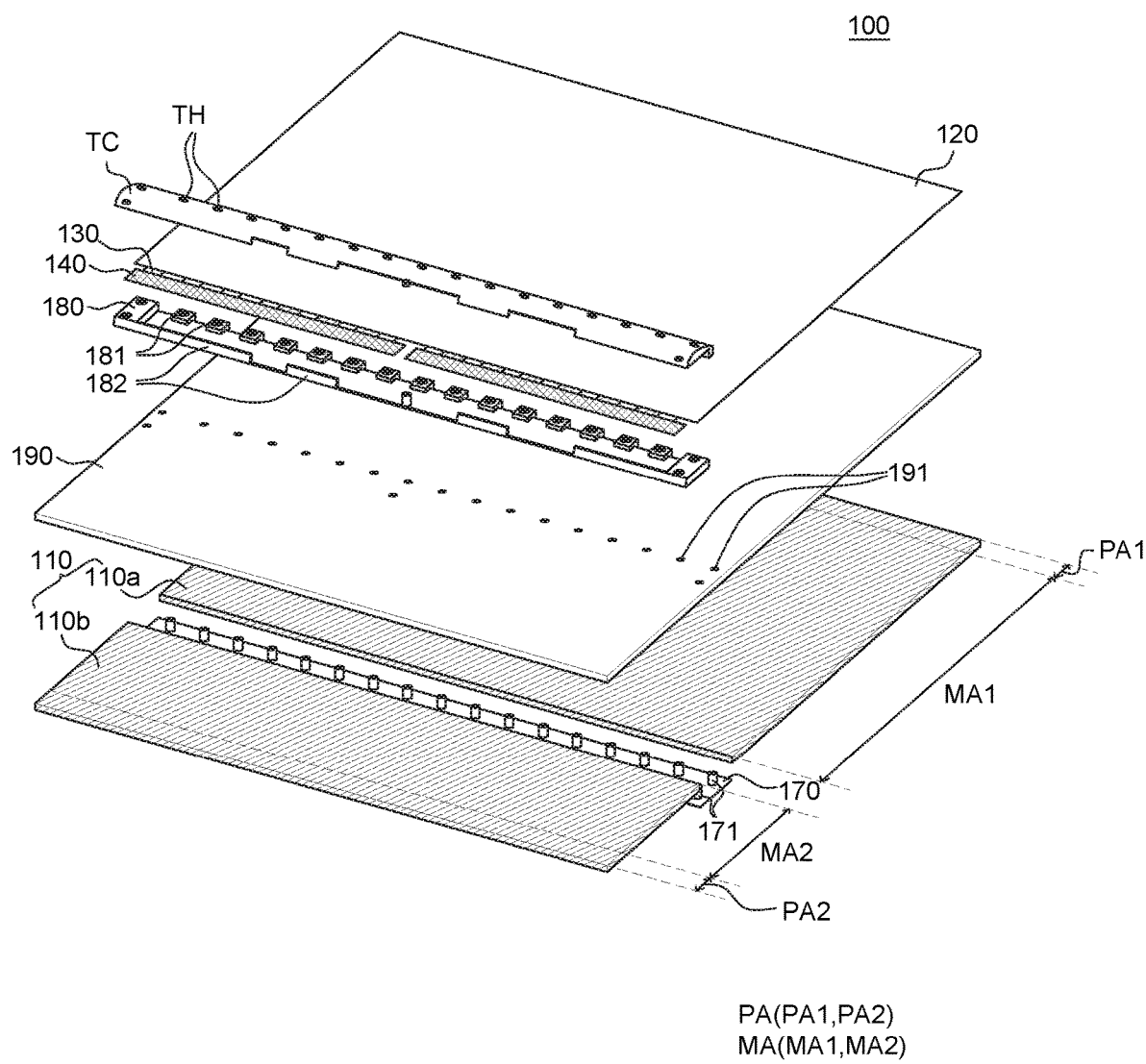
FIG. 5 is an exploded perspective view of the display device according to an example embodiment of the present disclosure.

FIG. 5 is an exploded perspective view of the display device according to an example embodiment of the present disclosure. For convenience of description, FIG. 5 schematically illustrates a back cover 110 and an adhesive part 190.

As illustrated in FIG. 5, the display device 100 may include the back cover 110, a base plate 170, the adhesive part 190, a bottom cover 180, and a top cover TC.

The back cover 110 may include a first back cover 110a and a second back cover 110b. The first back cover 110a may be disposed to overlap a display panel 120, and the second back cover 110b may be fixed to the roller unit. The first back cover 110a and the second back cover 110b may be spaced apart from each other. That is, a space may be formed between the first back cover 110a and the second back cover 110b, and the first back cover 110a and the second back cover 110b may be connected to each other by the adhesive part 190. The back cover 110 will be described below in more detail with reference to FIG. 8A and FIG. 8B.

The base plate 170 may be disposed on a rear surface of the back cover 110. Further, at least a portion of the base plate 170 may be exposed between the first back cover 110a and the second back cover 110b.

The base plate 170 may include a plurality of fixing protrusions 171 protruding from its surface facing toward the top cover TC. The plurality of fixing protrusions 171 may penetrate the adhesive part 190 and the bottom cover 180 disposed on the base plate 170 and the back cover 110, and then may be fastened to the top cover TC. That is, the plurality of fixing protrusions 171 may be fastened by penetrating a plurality of fixing holes 191 in the adhesive part 190, through-holes in protrusions 181 of the bottom cover 180, and a plurality of coupling holes TH in the top cover TC.

Figure 9:
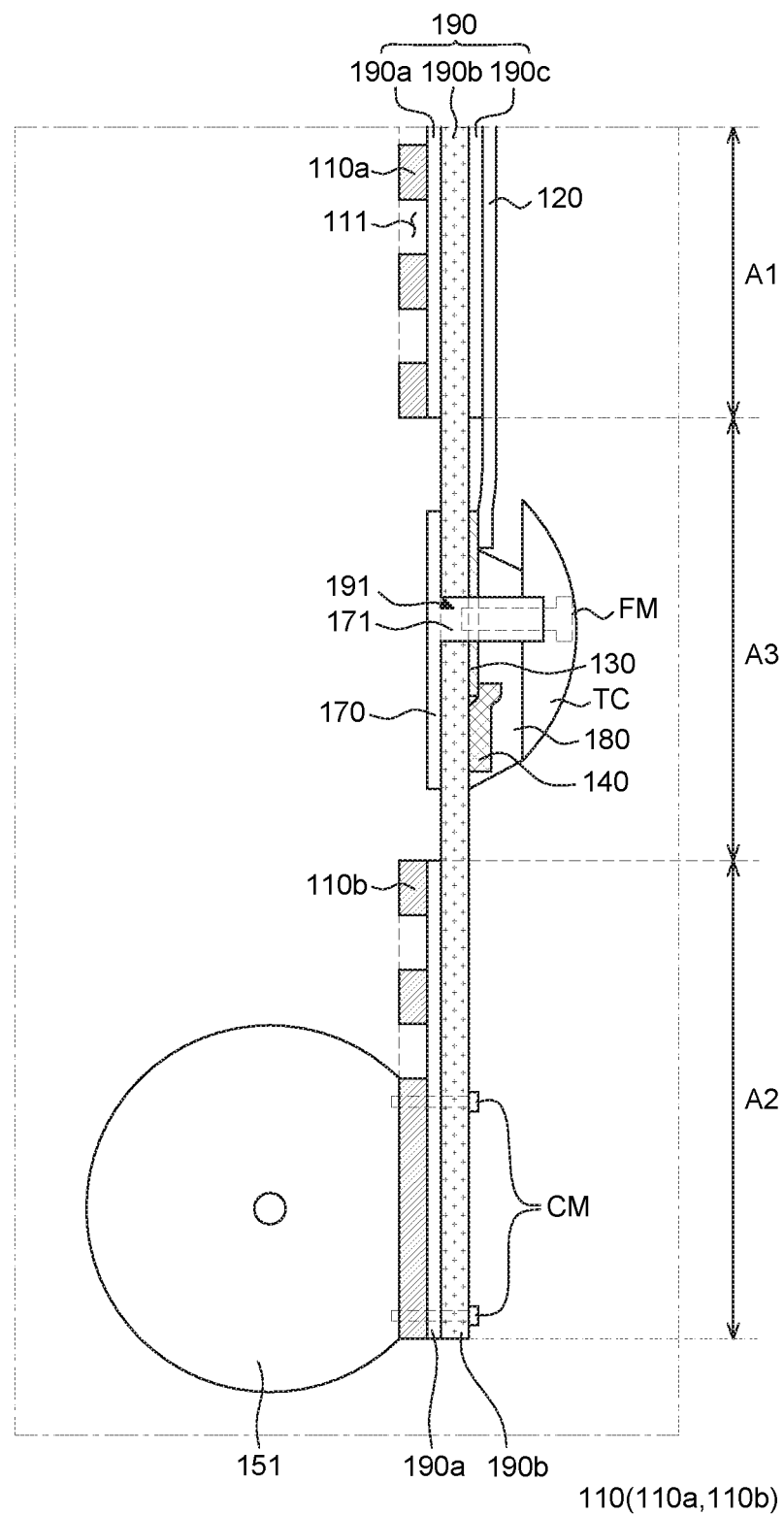
FIG. 9 is a cross-sectional view provided to explain a clamp structure of the display device according to an example embodiment of the present disclosure.

The plurality of fixing protrusions 171 may include a structure to which a plurality of fixing members FM can be fastened (see, for example, FIG. 9). For example, the plurality of fixing protrusions 171 may be formed as, e.g., pem nuts, and may include, e.g., screw threads therein. Thus, the plurality of fixing members FM may be fastened to the plurality of fixing protrusions 171 by the screw threads inside the plurality of fixing protrusions 171.

The adhesive part 190 may be disposed on the back cover 110 and the base plate 170. The adhesive part 190 may include an adhesive base film and an adhesive layer disposed on the adhesive base film (see, for example, FIGS. 7 and 9). That is, the adhesive layer formed of an adhesive material may be disposed on one or both surfaces of the adhesive base film. The adhesive base film and the adhesive layer of the adhesive part 190 will be described below in more detail with reference to FIG. 7 and FIG. 9.

The adhesive part 190 may include the plurality of fixing holes 191. The plurality of fixing holes 191 may be positioned correspondingly to the fixing protrusions 171 of the base plate 170. Thus, the fixing protrusions 171 of the base plate 170 can penetrate the plurality of fixing holes 191. Therefore, the adhesive part 190 can be fixed to the base plate 170, and the back cover 110 bonded to the adhesive part 190 can also be fixed not to separate from the base plate 170.

The bottom cover 180 may be disposed on the adhesive part 190. The bottom cover 180 may include a plurality of protrusions 181 disposed along one side of the bottom cover 180. Further, each flexible film 130 may be disposed between the plurality of protrusions 181. The plurality of protrusions 181 may each include an insertion hole. Thus, when the plurality of fixing protrusions 171 of the base plate 170 penetrates the plurality of insertion holes of the plurality of protrusions 181, respectively, the bottom cover 180 can be fixed to the base plate 170.

The bottom cover 180 may include guide members 182 disposed on the other side of the bottom cover 180 and protruding from a top surface of the bottom cover 180. The guide members 182 may be spaced apart from each other along an edge of the bottom cover 180 and may hold in place the printed circuit boards 140 disposed on the bottom cover 180 so as not to stray from the bottom cover 180.

The top cover TC may be disposed on the bottom cover 180. Specifically, the top cover TC may be disposed to cover the bottom cover 180 and the flexible films 130 and the printed circuit boards 140 disposed on the bottom cover 180. Thus, the top cover TC may protect the flexible films 130 and the printed circuit boards 140. Therefore, the top cover TC may be formed of an insulating material, such as resin, but is not limited thereto.

The top cover TC may have a curved outer peripheral surface. The top cover TC may have a curved outer peripheral surface to follow the shape of the back cover 110 being rolled up. In this case, the curved surface of the back cover 110 may have substantially the same radius of curvature as the roller 151. That is, during winding of the display device 100, the top cover TC may be disposed on a flat part of the roller 151. The top cover TC may have an outer peripheral surface having substantially the same radius of curvature as the roller 151. Thus, when the top cover TC is disposed on the flat part of the roller 151, the roller 151 and the top cover TC together may have a substantially circular cross-sectional shape.

The top cover TC may include a plurality of coupling holes TH disposed correspondingly to the plurality of fixing holes 191 in the adhesive part 190. Thus, the plurality of fixing members FM (see, for example, FIG. 9) may be disposed to penetrate the plurality of coupling holes TH in the top cover TC. The plurality of fixing members FM penetrating the plurality of coupling holes TH in the top cover TC may be fastened to the plurality of fixing protrusions 171 of the base plate 170, respectively. Thus, the base plate 170, the bottom cover 180, the top cover TC, and the adhesive part 190 can be fastened and/or fixed to one another. The plurality of fixing members FM fastening the base plate 170 and the top cover TC may be, e.g., screws, bolts, or other similar components, but are not limited thereto.

<Display Part>

Figure 6:
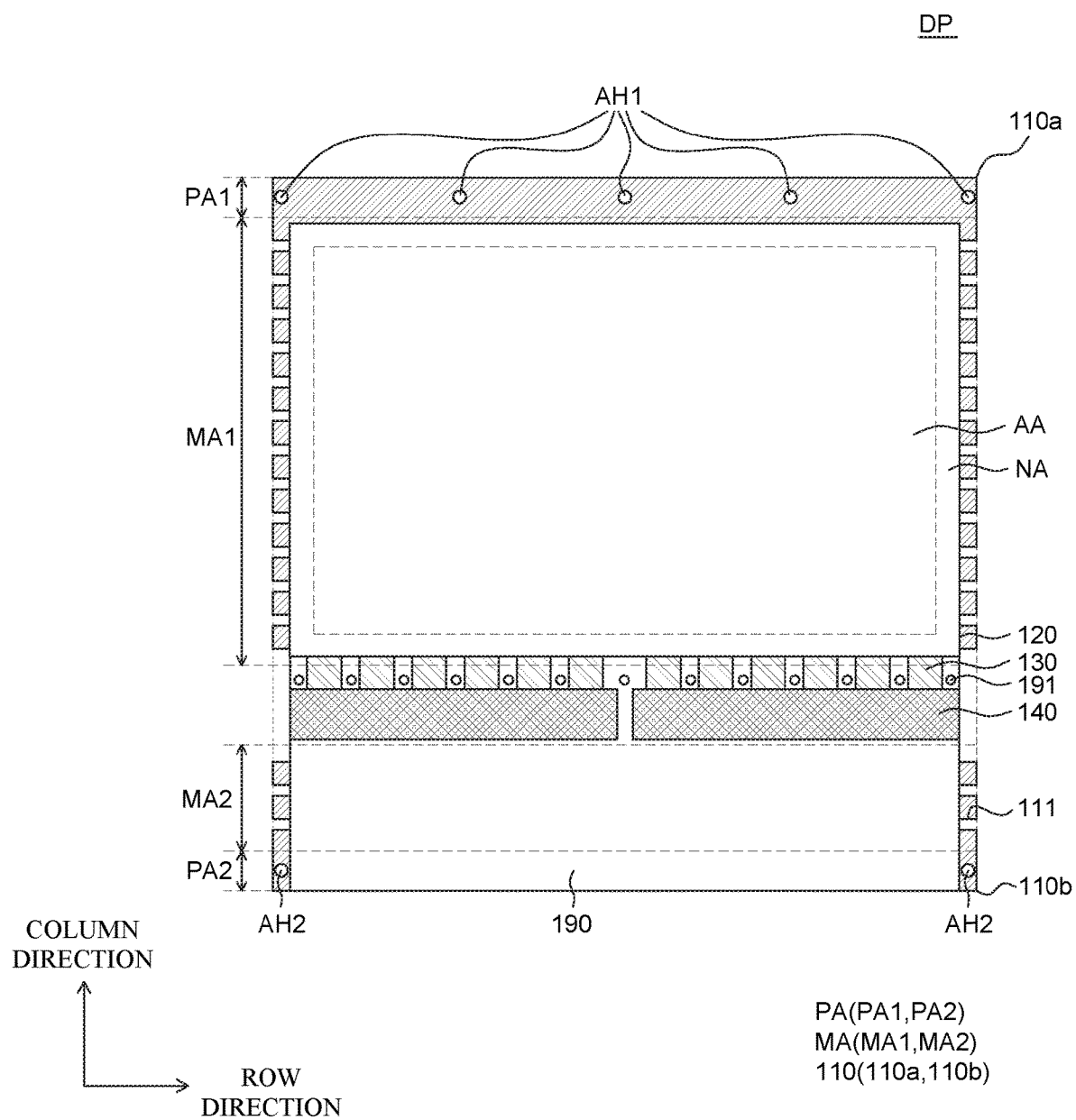
FIG. 6 is a plan view of a display part of the display device according to an example embodiment of the present disclosure.
Figure 7:
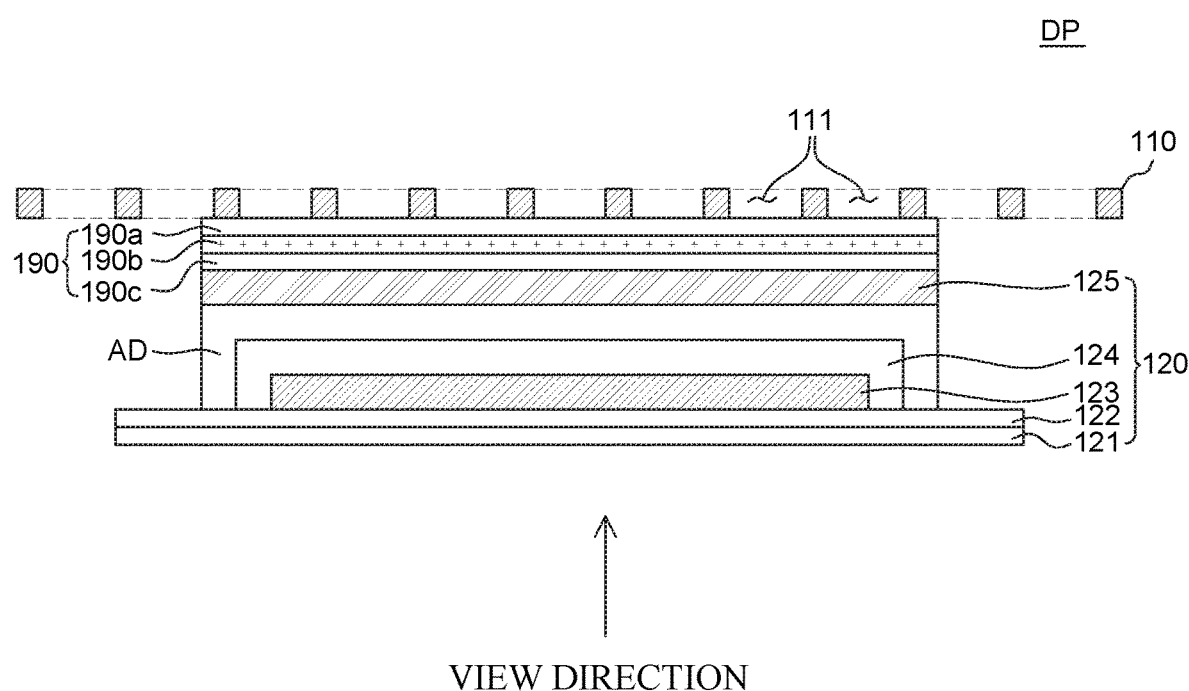
FIG. 7 is a cross-sectional view of the display part of the display device according to an example embodiment of the present disclosure.

FIG. 6 is a plan view of the display part DP of the display device according to an example embodiment of the present disclosure. FIG. 7 is a cross-sectional view of the display part DP of the display device according to an example embodiment of the present disclosure.

As illustrated in FIG. 6, the display part DP may include the back cover 110, the display panel 120, the flexible films 130, and the printed circuit boards 140.

The display panel 120 may be configured to display images to the user. In the display panel 120, display elements for displaying images, driving elements for driving the display elements, and lines for transmitting various signals to the display elements and the driving elements may be disposed. Different types of display elements may be employed depending on the kind of the display panel 120. For example, if the display panel 120 is an organic light emitting display panel, the display elements may be organic light emitting elements, each composed of an anode, an organic emission layer, and a cathode. As another example, if the display panel 120 is a liquid crystal display panel, the display elements may be liquid crystal display elements. Hereinafter, the display panel 120 may be described as an organic light emitting display panel as an example, but the display panel 120 is not limited to the organic light emitting display panel. Further, since the display device 100 according to an example embodiment of the present disclosure is a rollable display device, the display panel 120 may be implemented as a flexible display panel to be wound around or unwound from the roller 151.

The display panel 120 may include an active area AA and a non-active area NA.

The active area AA refers to an area where an image may be displayed on the display panel 120. In the active area AA, a plurality of sub-pixels and a circuit for driving the plurality of sub-pixels may be disposed. The plurality of sub-pixels may each represent a minimum unit of the active area AA, and a display element may be disposed in each of the plurality of sub-pixels. For example, an organic light emitting element composed of an anode, an organic emission layer, and a cathode may be disposed in each of the plurality of sub-pixels, but the present disclosure is not limited thereto. Further, the circuit for driving the plurality of sub-pixels may include, without limitation, a driving element and a line. For example, the circuit may be composed of such elements as a thin film transistor (TFT), a storage capacitor, a gate line, and a data line, but is not limited thereto.

The non-active area NA of the display part 120 is an area where no image is to be displayed. In the non-active area NA, various lines, circuits, and other components for driving the organic light emitting elements in the active area AA may be disposed. For example, in the non-active area NA, link lines for transmitting signals to the plurality of sub-pixels and circuits in the active area AA or driver ICs, such as a gate driver IC and a data driver IC, may be disposed. However, non-active area NA of the present disclosure is not limited thereto.

The flexible films 130 may include various components on a flexible base film and may serve to supply signals to the plurality of sub-pixels and circuits in the active area AA. The flexible films 130 may be electrically connected to the display panel 120. The flexible films 130 may be disposed at one end of the non-active area NA of the display panel 120 and may supply power voltage, data voltage, or other voltages or signals to the plurality of sub-pixels and circuits in the active area AA. The specific number of flexible films 130 illustrated in FIG. 6 is merely an example. The number of flexible films 130 is not limited to the illustrated example, and the number of flexible films may vary depending on the design.

On the flexible films 130, driver ICs, such as a gate driver IC and a data driver IC, may be disposed. The driver ICs may be configured to process data for displaying an image and a driving signal for processing the data. The driver ICs may be mounted in a Chip On Glass (COG) method, a Chip On Film (COF) method, a Tape Carrier Package (TCP), or other similar methods. For convenience of description, the driver ICs may be described, for example, as being mounted on the flexible films 130 in the COF method, but the present disclosure is not limited thereto.

The printed circuit boards 140 may be disposed on one ends of the flexible films 130 and connected to the flexible films 130. The printed circuit boards 140 may be configured to supply signals to the driver ICs. The printed circuit boards 140 may supply various signals, such as a drive signal, a data signal, or other signals, to the driver ICs. In the printed circuit boards 140, various components may be disposed. For example, a timing controller and a power supply unit, among others, may be disposed on the printed circuit boards 140. FIG. 6 illustrates two printed circuit boards 140 as an example. However, the number of printed circuit boards 140 is not limited to the illustrated example and may vary depending on the design.

Although not illustrated in FIG. 6, one or more additional printed circuit boards connected to the printed circuit boards 140 may be further employed. For example, the printed circuit boards 140 may be referred to as a source printed circuit board (source PCB) S-PCB on which a data driver is mounted. An additional printed circuit board connected to the printed circuit boards 140 may be referred to as a control printed circuit board (control PCB) C-PCB on which a timing controller or the like is mounted. The additional printed circuit boards may be disposed inside the roller 151, or may be disposed within the housing part HP outside the roller 151.

The back cover 110 may be disposed on rear surfaces of the adhesive part 190, the display panel 120, the flexible films 130, and the printed circuit boards 140, and may support the display panel 120, the flexible films 130, and the printed circuit boards 140. Thus, the back cover 110 may be larger in size than the display panel 120. That is, an outer edge of the back cover 110 may extend beyond a corresponding outer edge of the display panel 120. Therefore, if the display part DP is presented outside the housing part HP, the back cover 110 can protect the other components of the display part DP, particularly the display panel 120, against external impacts. The back cover 110 may be formed of a rigid material, but at least a part of the back cover 110 may have flexibility to be wound or unwound along with the display panel 120. For example, the back cover 110 may be formed of a metal material, such as Steel Use Stainless (SUS) or Invar, or a plastic material. However, the material of the back cover 110 is not limited thereto. Various different materials may be employed for the back cover 110 depending on the design as long as they can satisfy property characteristics, such as an amount of thermal deformation, a radius of curvature, rigidity, and the like.

As shown in FIG. 7, the display panel 120 may include a substrate 121, a buffer layer 122, a pixel unit 123, an encapsulation layer 124, and an encapsulation substrate 125.

The substrate 121 may serve as a base member to support various components of the display panel 120 and may be formed of an insulating material. The substrate 121 may be formed of a flexible material so that the display panel 120 may be wound or unwound. For example, the substrate 121 may be formed of a plastic material, such as polyimide (PI).

The buffer layer 122 may suppress diffusion of moisture and/or oxygen permeating from the outside of the substrate 121. The buffer layer 122 may be formed as a single layer or a multilayer of silicon oxide (SiOx) and silicon nitride (SiNx), but is not limited thereto.

The pixel unit 123 may include a plurality of organic light emitting elements and circuits for the organic light emitting elements. The pixel unit 123 may be disposed in an area corresponding to the active area AA. Each organic light emitting element may include an anode, an organic emission layer, and a cathode.

The anode may supply holes into the organic emission layer and may be formed of a conductive material having a high work function. For example, the anode may be formed of tin oxide (TO), indium tin oxide (ITO), indium zinc oxide (IZO), indium zinc tin oxide (ITZO), or the like, but is not limited thereto.

The organic emission layer may receive holes from the anode and electrons from the cathode, and thus emit light. The organic emission layer may be one of a red organic emission layer, a green organic emission layer, a blue organic emission layer, and a white organic emission layer depending on the color of light emitted from the organic emission layer. If the organic emission layer is a white organic emission layer, color filters of various colors may be further provided.

The cathode may supply electrons into the organic emission layer and may be formed of a conductive layer having a low work function. For example, the cathode may be formed of one or more materials selected from a group of metals, such as magnesium (Mg), silver (Ag), and aluminum (Al) and alloys thereof, but is not limited thereto.

The display panel 120 may be classified into a top emission type or a bottom emission type according to a transmission direction of light emitted from the organic light emitting element.

In the top emission type, light emitted from the organic light emitting element may be discharged away from the substrate 121 on which the organic light emitting element is disposed. If the display panel 120 is of top emission type, a reflective layer may be further provided under the anode. This is to discharge light emitted from the organic light emitting element away from the substrate 121, i.e., toward the cathode.

In the bottom emission type, light emitted from the organic light emitting element is discharged toward the substrate 121 on which the organic light emitting element is formed. If the display panel 120 is of bottom emission type, the anode may be formed of a transparent conductive material only and the cathode may be formed of a metal material having high reflectivity. This is to discharge light emitted from the organic light emitting element toward the substrate 121.

Hereafter, for convenience of description, the display device 100 according to an example embodiment of the present disclosure will be described as a bottom emission type display device, but is not limited thereto.

In the pixel unit 123, a circuit for driving organic light emitting elements may be disposed. The circuit may be composed of a TFT, a storage capacitor, a gate line, a data line, a power line, and possibly other components. The components of the circuit may vary depending on the design of the display device 100.

The encapsulation layer 124 may be disposed on and cover the pixel unit 123. The encapsulation layer 124 may seal the organic light emitting elements of the pixel unit 123. The encapsulation layer 124 may protect the organic light emitting elements of the pixel unit 123 against external moisture, oxygen, impacts, and the like. The encapsulation layer 124 may be formed by alternately laminating a plurality of inorganic layers and a plurality of organic layers. For example, the inorganic layers may be formed of inorganic materials, such as silicon nitride (SiNx), silicon oxide (SiOx), and aluminum oxide (AlOx), but are not limited thereto. For example, the organic layers may be formed of epoxy-based or acryl-based polymers, but are not limited thereto.

The encapsulation substrate 125 may be disposed on the encapsulation layer 124. The encapsulation substrate 125 may protect the organic light emitting elements of the pixel unit 123 together with the encapsulation layer 124. The encapsulation substrate 125 may protect the organic light emitting elements of the pixel unit 123 against external moisture, oxygen, impacts, and the like. The encapsulation substrate 125 may be formed of a metal material which has high corrosion resistance and can be easily processed into a foil or a thin film. Examples of the metal material may include, without limitation, aluminum (Al), nickel (Ni), chromium (Cr), and an alloy of iron (Fe) and Ni. Thus, since the encapsulation substrate 125 may be formed of a metal material, the encapsulation substrate 125 can be implemented in the form of an ultra-thin film and can provide high resistance to external impacts and scratches.

An adhesive member AD may be disposed between the encapsulation layer 124 and the encapsulation substrate 125. The adhesive member AD may bond the encapsulation layer 124 and the encapsulation substrate 125 to each other. The adhesive member AD may be formed of an adhesive material and may be a thermosetting or naturally-curable adhesive. For example, the adhesive member AD may be formed of an optical clear adhesive (OCA), a pressure sensitive adhesive (PSA), or the like, but is not limited thereto.

The adhesive member AD may be disposed to cover the encapsulation layer 124 and the pixel unit 123. That is, the pixel unit 123 may be sealed by the buffer layer 122 and the encapsulation layer 124, and the encapsulation layer 124 and the pixel unit 123 may be sealed by the buffer layer 122 and the adhesive member AD. The adhesive member AD may protect the organic light emitting elements of the pixel unit 123 against external moisture, oxygen, impacts, and the like, together with the encapsulation layer 124 and the encapsulation substrate 125. In this case, the adhesive member AD may further contain a moisture absorbent. The moisture absorbent may include hygroscopic particles and may absorb moisture and oxygen from the outside to minimize permeation of moisture and oxygen into the pixel unit 123.

The back cover 110 may be disposed on the encapsulation substrate 125. The back cover 110 may be disposed to be in contact with the encapsulation substrate 125 of the display panel 120 to protect the display panel 120. The back cover 110 may be formed of a rigid material to protect the display panel 120.

The adhesive part 190 may be disposed between the encapsulation substrate 125 and the back cover 110. The adhesive part 190 may bond the encapsulation substrate 125 and the back cover 110 together.

As illustrated in FIG. 7, the adhesive part 190 may include the adhesive base film 190b, and adhesive layers 190a and 190c each disposed on respective surfaces of the adhesive base film 190b. The adhesive layers 190a and 190c may include a first adhesive layer 190a disposed between the back cover 110 and the adhesive base film 190b and bonded to the back cover 110. Also, the adhesive layers 190a and 190c may include a second adhesive layer 190c disposed between the encapsulation substrate 125 and the adhesive base film 190b and bonded to the encapsulation substrate 125. The adhesive base film 190b may be formed of a material having sufficient rigidity to support a structure bonded to the adhesive layers 190a and 190c, as well as sufficient flexibility to be rolled up during winding or unwinding of the roller unit 150. For example, the adhesive base film 190b may be formed of a plastic-based material, such as thermoplastic olefinic elastomer (TPO), polyurethane (PU), polyethylene terephthalate (PET), or the like, but is not limited thereto. A material or materials for the adhesive base film 190b may vary depending on the design. Further, the adhesive layers 190a and 190c may be formed of an acrylic based material, but is not limited thereto. A material or materials for the adhesive layers 190a and 190c may vary depending on the design.

FIG. 7 illustrates that a plurality of openings 111 of the back cover 110 is not filled with the first adhesive layer 190a. However, some or all of the plurality of openings 111 of the back cover 110 may be filled with the first adhesive layer 190a. If the first adhesive layer 190a fills the plurality of openings 111 of the back cover 110, a contact area between the first adhesive layer 190a and the back cover 110 increases. Thus, it is possible to prevent or suppress separation between the back cover 110 and the first adhesive layer 190a, thus preventing or suppressing separation between the back cover 110 and the display panel 120.

Although not illustrated in FIG. 7, a transparent film may be further disposed on a front surface of the substrate 121 (i.e., a lower surface of the substrate 121 as illustrated in FIG. 7). The transparent film may function to protect a front surface or a viewing surface of the display panel 120 or minimize reflection of external light incident on the display panel 120. For example, the transparent film may be at least one of a polyethylene terephthalate (PET) film, an anti-reflection film, a polarizing film, and a transmittance controllable film, but is not limited thereto.

Hereafter, the back cover 110 will be described in more detail with reference to FIG. 8A and FIG. 8B.

<Detailed Configuration of an Example Back Cover>

Figure 8A:
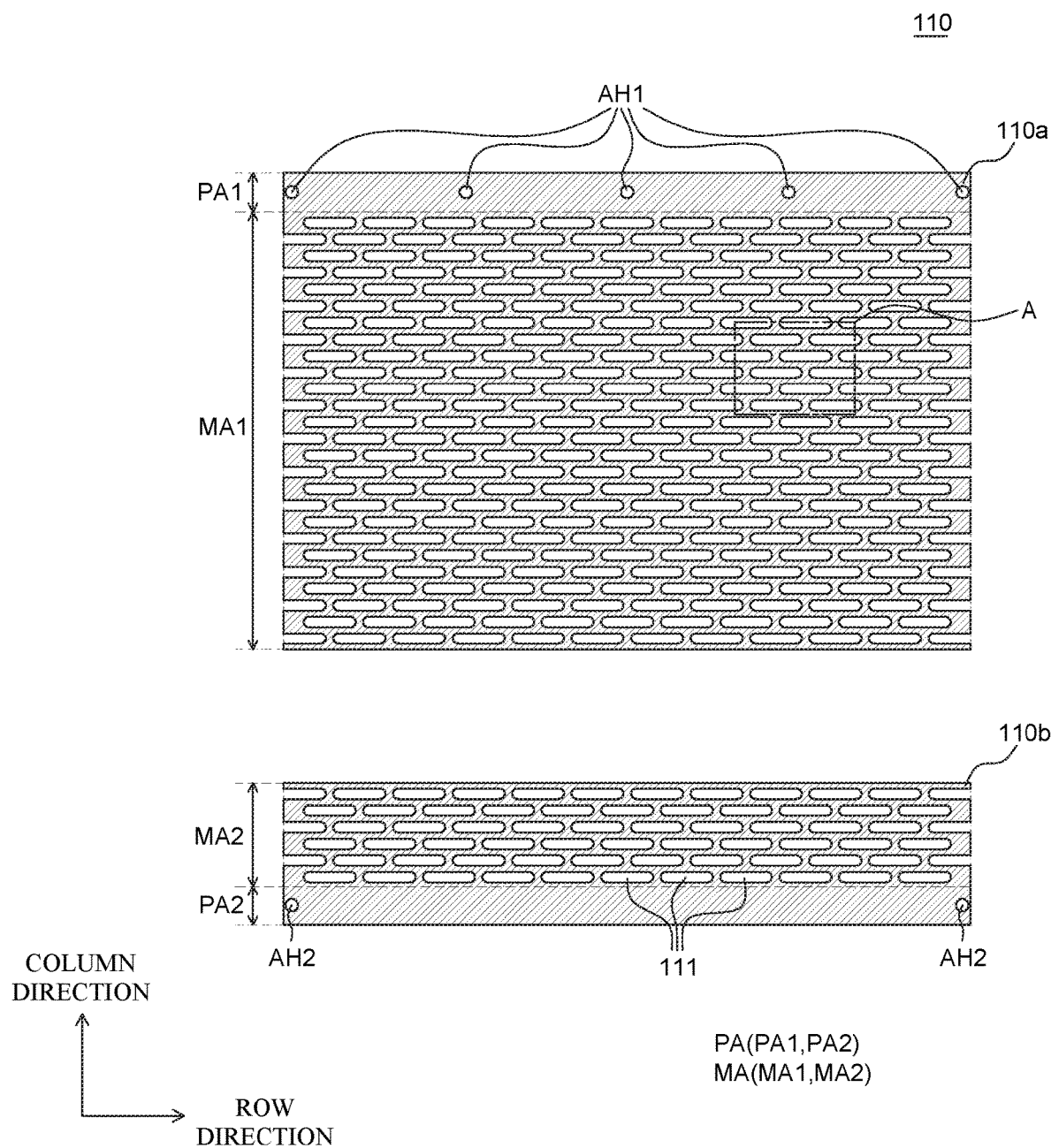
FIG. 8A is a plan view of a back cover of the display device according to an example embodiment of the present disclosure.

FIG. 8A is a plan view of a back cover of the display device according to an example embodiment of the present disclosure. FIG. 8B is an enlarged view of a region "A" of FIG. 8A.

As illustrated in FIG. 8A, the back cover 110 may include the first back cover 110a and the second back cover 110b. The back cover 110 may be divided into the first back cover 110a and the second back cover 110b at the boundary between two flexible areas MA.

Each of the first back cover 110a and the second back cover 110b may include a flexible area MA and a supporting area PA extending from the flexible area MA. Specifically, the first back cover 110a may include a first flexible area MA1 overlapping the display panel 120 and a first supporting area PA1 extending from the first flexible area MA1. The second back cover 110b may include a second supporting area PA2 fixed to the roller unit 150 and a second flexible area MA2 extending from the second supporting area PA2 toward the first back cover 110a.

As shown in FIG. 8A, the first supporting area PA1 of the first back cover 110a may be at the uppermost area of the back cover 110 and may be fastened to the head bar 164. The first supporting area PA1 may include the first fastening holes AH1 to be fastened with the head bar 164. Further, as described above with reference to FIG. 3, the screws SC penetrating the head bar 164 and the first fastening holes AH1 may be provided to fasten the head bar 164 to the first supporting area PA1 of the first back cover 110a. Further, since the first supporting area PA1 may be fastened to the head bar 164, the back cover 110 can move up or down at the same time when the link unit 162 fixed to the head bar 164 moves up or down. The display panel 120 attached to the back cover 110 can also move up or down. FIG. 8A illustrates five first fastening holes AH1 as an example, but the number of first fastening holes AH1 may vary and is not limited to this illustrated example. Further, FIG. 8A illustrates that the first back cover 110a may be fastened to the head bar 164 using the first fastening holes AH1. However, the present disclosure is not limited thereto. The back cover 110 may be attached to the head bar 164 without separate fastening holes.

As shown in FIG. 8A, the second supporting area PA2 of the second back cover 110b may be the lowermost area of the back cover 110 and may be fixed to the roller 151. The second supporting area PA2 may include second fastening holes AH2 to be fastened to the roller 151. For example, coupling members CM (see, e.g., FIGS. 9 and 10) penetrating the roller 151 and the second fastening holes AH2 may be provided to fasten the roller 151 to the second supporting area PA2 of the second back cover 110b. Further, since the second supporting area PA2 may be fastened to the roller 151, the second back cover 110b may be wound around or unwound from the roller 151 by rotation of the roller 151. FIG. 8A illustrates two second fastening holes AH2 as an example, but the number of second fastening holes AH2 may vary and is not limited to the illustrated example.

The first back cover 110a and the second back cover 110b of the back cover 110 may be separated from each other at a distance equal to or greater than the width of a flat surface of the roller 151. When the back cover 110 is wound and disposed on a curved surface adjacent to the flat surface of the roller 151, stress may be applied to the back cover 110. That is, the interface between the flat surface and the curved surface of the roller 151 may have the smallest radius of curvature. Thus, the back cover 110 may be damaged by stress generated during winding. Therefore, a distance between the first back cover 110a and the second back cover 110b may be set equal to or greater than the length of the flat surface of the roller 151 to minimize or suppress the stress. Thus, the back cover 110 may be configured not to be disposed on the flat part of the roller 151. Accordingly, it is possible to minimize or suppress stress that may be applied to the back cover 110 during winding of the back cover 110.

The flexible area MA of the back cover 110 may be wound around or unwound from the roller 151 together with the display panel 120. The flexible area MA may overlap at least the display panel 120 among the other components of the display part DP.

The plurality of openings 111 may be disposed in the flexible area MA of the back cover 110. That is, the plurality of openings 111 may be disposed in the first flexible area MA1 of the first back cover 110a and in the second flexible area MA2 of the second back cover 110b. During winding or unwinding of the display part DP, the plurality of openings 111 may be deformed by stress applied to the display part DP. Specifically, during winding or unwinding of the display part DP, the flexible area MA of the back cover 110 may be deformed as the plurality of openings 111 contracts or expands. Further, since the plurality of openings 111 may contract or expand, a slip phenomenon of the display panel 120 disposed on the flexible area MA of the back cover 110 can be minimized or suppressed. Therefore, stress applied to the display panel 120 can be minimized or suppressed. The plurality of openings 111 of the back cover 110 may be formed by etching. That is, the back cover 110 including the plurality of openings 111 may be manufactured by unidirectionally or bidirectionally etching a metal plate that forms the back cover 110.

During winding of the display panel 120 and the back cover 110, there may be a difference in length between the display panel 120 and the back cover 110 which are wound around the roller 151. This is because there is a difference in radius of curvature between the display panel 120 and the back cover 110. For example, if the back cover 110 and the display panel 120 are wound around the roller 151, the back cover 110 and the display panel 120 may need different lengths to be wound once around the roller 151. That is, the display panel 120 is disposed farther away from the roller 151 than the back cover 110 and thus may need a larger length to be wound once around the roller 151 than the back cover 110. As such, a difference in radius of curvature during winding of the display part DP may cause a difference in length for winding of the back cover 110 and the display panel 120. Thus, the display panel 120 attached to the back cover 110 may slip and move from its original position. In this case, a phenomenon that the display panel 120 slips from the back cover 110 due to differences in stress and radius of curvature caused by winding may be defined as a slip phenomenon. If an excessive slip occurs, the display panel 120 may be detached from the back cover 110 or defects such as cracks may occur.

In this case, in the display device 100 according to an example embodiment of the present disclosure, even if the display part DP is applied with stress while being wound or unwound, the plurality of openings 111 of the back cover 110 may be flexibly deformed to reduce stress applied to the back cover 110 and the display panel 120. For example, when the back cover 110 and the display panel 120 are wound around the roller 151, stress that deforms the back cover 110 and the display panel 120 in up and down directions may be applied thereto. In this case, the plurality of openings 111 of the back cover 110 may expand in the up and down directions of the back cover 110 and the length of the back cover 110 may also be flexibly changed. Therefore, during winding of the back cover 110 and the display panel, the plurality of openings 111 of the back cover 110 may compensate for a difference in length between the back cover 110 and the display panel 120 caused by a difference in radius of curvature. Further, during winding of the back cover 110 and the display panel 120, the plurality of openings 111 may be deformed to reduce stress applied to the display panel 120 from the back cover 110.

Figure 8B:
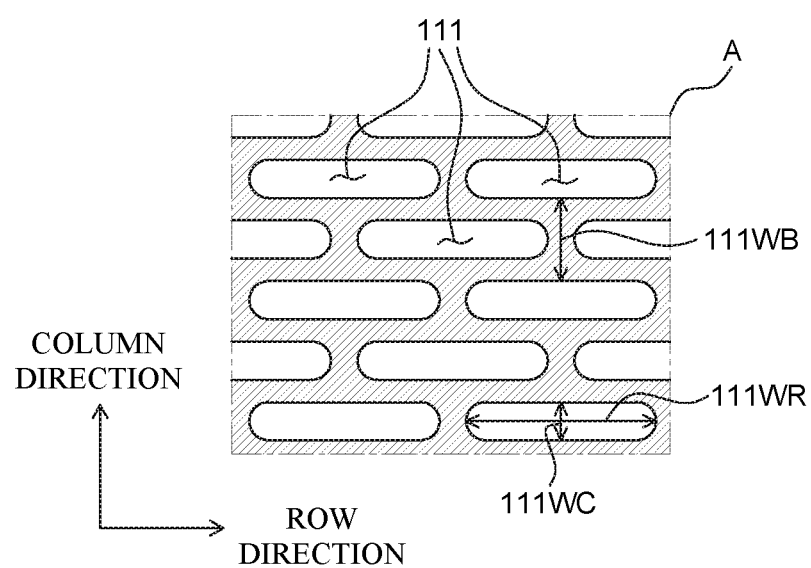
FIG. 8B is an enlarged view of a region "A" of FIG. 8A.

As illustrated in FIG. 8A and FIG. 8B, the plurality of openings 111 may be staggered with the plurality of openings 111 of adjacent rows. For example, the plurality of openings 111 of one row may be staggered with respect to the plurality of openings 111 of rows adjacent to the corresponding row. Specifically, the centers of plurality of openings 111 in odd-numbered rows may be offset from the centers of the plurality of openings 111 in even-numbered rows by as much as, e.g., ½ of the width 111WR (see, e.g., FIG. 8B) of each opening 111 in a row-direction. The placement and arrangement of the plurality of openings 111 are shown in FIG. 8A as an example only, and are not limited thereto.

Since the plurality of openings 111 in one row may be staggered with respect to the openings 111 in an adjacent row, a distance 111WB (see, e.g., FIG. 8B) between the two adjacent openings 111 with their centers aligned in the column direction can be reduced or minimized. Specifically, in the flexible areas MA, an area between the plurality of openings 111 whose centers are aligned in the column direction may have rigidity. Further, during winding of the back cover 110, the back cover 110 may be bent in the column direction. Thus, as the length 111WB of the area between two adjacent openings 111 whose centers are aligned in the column direction increases, it may become more difficult to bend the back cover 110 in the column direction. In this case, since the plurality of openings 111 is staggered from row to row, the distance 111WB between the plurality of openings 111 whose centers are aligned in the column direction can be reduced or minimized, compared to an arrangement in which the openings 111 are not staggered from row to row. Also, the area between the plurality of openings 111 can be reduced or minimized. Therefore, the distance 111WB between the plurality of openings 111 whose centers are aligned in the column direction may be reduced or minimized, and the flexible areas MA may be extended continuously in the column direction to remove or reduce the area where the plurality of openings 111 is not disposed. Also, because the length 111WB of the area between the plurality of openings 111 having rigidity in the column direction can be reduced or minimized, the overall rigidity of the back cover 110 can be improved without interfering with winding or unwinding of the back cover 110.

As illustrated in FIG. 8B, the maximum width 111WR of the plurality of openings 111 in the row direction may be larger than the maximum width 111WC in the column direction. That is, as shown in FIG. 8B, the maximum width 111WR of the plurality of openings 111 in a transverse or the row direction may be larger than the maximum width 111WC of the plurality of openings 111 in a vertical or the column direction.

As the width 111WR of the plurality of openings 111 in the row direction increases, it may become easier for the flexible areas MA of the back cover 110 to be flexibly deformed. Specifically, during winding of the back cover 110, the back cover 110 may be bent in the column direction, and stress may be applied to expand the plurality of openings 111 in the column direction. In this case, if the width 111WR of the plurality of openings 111 in the row direction increases, when the plurality of openings 111 is stretched in the column direction, the column-direction width 111WC of the plurality of openings 111 may increase by a greater amount. Further, as the plurality of openings 111 expands in the column direction, stress applied to the flexible areas MA may be reduced. Therefore, by increasing the row-direction width 111WR of the plurality of openings 111, the flexible areas MA of the back cover 110 can be more easily wound or unwound, and stress applied to the flexible areas MA can be reduced.

As the column-direction width 111WC of the plurality of openings 111 increases, the plurality of openings 111 may be more easily formed. However, if the column-direction width 111WC of the plurality of openings 111 increases, the aperture ratio of the plurality of openings 111 in the flexible areas MA may increase. Also, a contact area between the display panel 120 and the back cover 110 which are attached to the flexible areas MA may decrease. In this case, if an overlap area between the display panel 120 and the back cover 110, i.e., a contact area between the back cover 110 and the first adhesive layer 190a, decreases, the back cover 110 may be separated from the first adhesive layer 190a. Therefore, the column-direction width 111WC of the plurality of openings 111 may be controlled to control the adhesive strength between the display panel 120 and the back cover 110 to suppress or prevent separation therebetween. Further, the row-direction width 111WR of the plurality of openings 111 may be controlled such that the back cover 110 can have high flexibility.

In this case, the plurality of openings 111 may be formed in the flexible areas MA, but not in the first supporting area PA1 or the second supporting area PA2. That is, the first fastening holes AH1 and the second fastening holes AH2 may be formed in the first supporting area PA1 and the second supporting area PA2, respectively. However, the plurality of openings 111 formed in the flexible areas MA is not formed in the first supporting area PA1 or the second supporting area PA2. Further, the first fastening holes AH1 and the second fastening holes AH2 may be different in shape from the plurality of openings 111. The first supporting area PA1 and the second supporting area PA2 may be fixed to the head bar 164 and the roller 151, respectively. Thus, the first supporting area PA1 and the second supporting area PA2 may have higher rigidity than the flexible areas MA. Specifically, since the first supporting area PA1 and the second supporting area PA2 have higher rigidity, the first supporting area PA1 and the second supporting area PA2 can be securely fixed to the head bar 164 and the roller 151, respectively. Therefore, the display part DP may be fixed to the roller 151 and the head bar 164 of the moving part MP, and can move in and out of the housing part HP according to an operation of the moving part MP.

In the display device 100 according to an example embodiment of the present disclosure, the back cover 110 including the plurality of openings 111 may be disposed on the rear surface of the display panel 120 to support and protect the display panel 120. The back cover 110 may be formed of a metal material and thus may have rigidity. Also, the flexible areas MA of the back cover 110 to which the display panel 120 is attached may include the plurality of openings 111, and the back cover 110 may accordingly have improved flexibility. Therefore, in the fully unwound state in which the display part DP of the display device 100 is presented outside the housing part HP, the back cover 110 formed of a rigid material and having high rigidity may support the display panel 120 to be spread flat. On the other hand, in the fully wound state in which the display part DP of the display device 100 is housed inside the housing part HP, the back cover 110 having high flexibility due to the plurality of openings 111 may be wound around the roller 151 and be housed together with the display panel 120 in the housing part HP.

In addition, in the display device 100 according to an example embodiment of the present disclosure, the row-direction width 111WR of the plurality of openings 111 may be controlled such that the back cover 110 can have flexibility. Further, stress applied to the back cover 110 during a winding operation can be reduced. Specifically, during winding of the back cover 110 and the display panel 120 around the roller 151, the back cover 110 may be bent in the column direction, and stress may be applied to expand the plurality of openings 111 in the column direction. Since the plurality of openings 111 has a relatively large row-direction width 111WR, the plurality of openings 111 can more easily expand in the column direction during winding of the back cover 110 and the display panel 120 around the roller 151, thereby reducing the stress applied to the back cover 110. Therefore, in the display device 100 according to an example embodiment of the present disclosure, by controlling the row-direction width 111WR of the plurality of openings 111, the flexibility of the back cover 110 can be improved, and the back cover 110 and the display panel 120 can be more easily wound around the roller 151. Further, since the plurality of openings 111 can reduce stress applied to the back cover 110 and the display panel 120 while expanding in the column direction, potential damages to the display panel 120 can be suppressed.

Furthermore, in the display device 100 according to an example embodiment of the present disclosure, the column-direction width 111WC of the plurality of openings 111 may be controlled to control adhesive strength between the back cover 110 and the display panel 120. Specifically, the display panel 120 may be attached to the flexible area MA of the back cover 110. In this case, as the aperture ratio of the plurality of openings 111 in the flexible area MA increases, a contact area between the display panel 120 and the back cover 110 decreases. Thus, the adhesive strength between the display panel 120 and the back cover 110 may decrease. However, in the display device 100 according to an example embodiment of the present disclosure, the plurality of openings 111 in the back cover 110 may have a relatively small column-direction width 111WC. Thus, the aperture ratio of the plurality of openings 111 can be reduced, and the contact area between the display panel 120 and the back cover 110 can be increased. As the contact area between the display panel 120 and the back cover 110 increases, the adhesive strength between the display panel 120 and the back cover 110 can be improved. Therefore, in the display device 100 according to an example embodiment of the present disclosure, by controlling the column-direction width 111WC of the plurality of openings 111, the adhesive strength between the back cover 110 and the display panel 120 can be maintained at a certain level or higher to suppress separation therebetween.

In addition, the row-direction width of the plurality of openings 111 may be larger than the column-direction width, and the shape of the plurality of openings 111 is not limited to the example shape illustrated in FIG. 8A and FIG. 8B. The plurality of openings 111 may have various shapes, such as a dumbbell shape, a diamond shape, a ribbon shape, an oval shape, or other similar shapes.

Hereinafter, a clamp structure of the display device 100 according to an example embodiment of the present disclosure will be described in more detail with reference to FIG. 9.

<Clamp Structure of an Example Base Plate and an Example Top Cover>

FIG. 9 is a cross-sectional view provided to explain a clamp structure of the display device according to an example embodiment of the present disclosure. The clamp structure of the display device 100 according to an example embodiment of the present disclosure will be described in more detail with reference to FIG. 5, as well as to FIG. 9.

As illustrated in FIG. 9, the adhesive layers 190a and 190c may be disposed only in a partial area of the adhesive base film 190b. Specifically, the first adhesive layer 190a may be disposed only in an area where the adhesive base film 190b overlaps the back cover 110. Also, the second adhesive layer 190c may be disposed only in an area where the adhesive base film 190b overlaps the display panel 120.

More specifically, referring to FIG. 9, the adhesive part 190 may include a first area A1, a second area A2, and a third area A3.

The first area A1 of the adhesive part 190 may overlap the first back cover 110a and the display panel 120, and the adhesive layers 190a and 190c may both be disposed on the respective sides of the adhesive base film 190b. That is, in the first area A1, the first adhesive layer 190a may be disposed on one surface of the adhesive base film 190b, and the first back cover 110a may be bonded to the first adhesive layer 190a. Also, the second adhesive layer 190c may be disposed on the other surface of the adhesive base film 190b, and the display panel 120 may be bonded to the second adhesive layer 190c.

In the second area A2 of the adhesive part 190, the adhesive part 190 may be fixed to the roller unit 150, and the first adhesive layer 190a may be disposed on one surface of the adhesive base film 190b. That is, the first adhesive layer 190a may be disposed in the second area A2, but not the second adhesive layer 190b. As shown in FIG. 9, the first adhesive layer 190a is disposed in the second area A2, and the second back cover 110b may be bonded to the adhesive part 190 by the first adhesive layer 190a. In this case, the second back cover 110b and the adhesive part 190 may be securely fixed to the roller 151 by a plurality of coupling members CM. The plurality of coupling members CM may be, e.g., screws, bolts, or the like, but is not limited thereto.

The third area A3 of the adhesive part 190 may be disposed between the first area A1 and the second area A2. In the third area A3 of the adhesive part 190, the adhesive base film 190b may be disposed, but not the first adhesive layer 190a or the second adhesive layer 190c. That is, in the third area A3, the first adhesive layer 190a and the second adhesive layer 190c are not disposed, but the adhesive base film 190b is disposed. A portion where the flexible film 130 and the printed circuit board 140 are disposed in the third area A3 may be mounted on the flat surface of the roller 151 during winding of the display device 100.

As illustrated in FIG. 9, in the third area A3 of the adhesive part 190, the base plate 170, the bottom cover 180, and the top cover TC may be fastened to one another. Specifically, the plurality of fixing protrusions 171 of the base plate 170 may penetrate the fixing holes 191 disposed in the third area A3 of the adhesive part 190 and a plurality of through-holes in the protrusions 181 of the bottom cover 180 (see also, for example FIG. 5). Thus, the adhesive part 190 and the bottom cover 180 may be fixed. Further, the plurality of fixing protrusions 171 may be covered by the top cover TC, and the top cover TC and the base plate 170 may therefore be fastened to each other. In this case, the plurality of fixing members FM may be inserted through the plurality of coupling holes TH in the top cover TC and be coupled to the plurality of fixing protrusions 171 of the base plate 170. Thus, the top cover TC, the adhesive part 190, the bottom cover 180, and the base plate 170 may be fixed to one another. Also, the display panel 120, the flexible film 130, and the printed circuit board 140 between the bottom cover 180 and the top cover TC may also be securely fixed. However, the present disclosure is not limited thereto. That is, the base plate 170 and the top cover TC may be fastened to each other by a bidirectional clamping method.

The plurality of fixing members FM may be fastened to the plurality of fixing protrusions 171 to fix the base plate 170, the back cover 110, the bottom cover 180, and the top cover TC. Specifically, the plurality of fixing members FM may be disposed to penetrate the plurality of coupling holes TH in the top cover TC. The plurality of fixing members FM penetrating the plurality of coupling holes TH in the top cover TC may be fastened to the plurality of fixing protrusions 171 of the base plate 170. Thus, the base plate 170, the bottom cover 180, the top cover TC, and the back cover 110 may be fastened and fixed to one another. The plurality of fixing members FM fastening the base plate 170 and the top cover TC together may be, e.g., screws, bolts, or the like, but is not limited thereto.

Further, in the display device 100 according to an example embodiment of the present disclosure, the back cover 110 may be divided into the first back cover 110a and the second back cover 110b. Thus, it is possible to minimize stress concentrated on the back cover 110 during winding of the display device 100. Specifically, if the first back cover 110a and the second back cover 110b are formed as one body, i.e., if the back cover 110 is formed as a single layer, a part of the back cover 110 would be wound on the flat surface of the roller 151 during winding of the back cover 110. Also, another part of the back cover 110 would be wound on the curved surface adjacent to the flat surface of the roller 151. In this case, the interface between the flat surface and the curved surface of the roller 151 may have the smallest radius of curvature. Thus, the back cover 110 may be damaged by stress generated during winding, including at the interface between the flat surface and the curved surface of the roller 151. Therefore, if the back cover 110 is provided as divided parts, stress generated while the back cover 110 is wound on the roller 151 may be minimized or suppressed, compared to a configuration in which the back cover 110 is formed as one body. Accordingly, potential damage to the back cover 110 can be minimized or suppressed.

Further, in the display device 100 according to an example embodiment of the present disclosure, the back cover 110 may include the first back cover 110a and the second back cover 110b. Thus, even when the display device 100 has a large size, the back cover 110 can be more easily manufactured corresponding in size to the display device 100. The display device 100 according to an example embodiment of the present disclosure is a rollable display device and can be manufactured in various sizes. In response to users' demand for larger display devices, research is continuing on increasing the size of rollable display devices. If the display device 100, including the display panel 120, is increased in size, the back cover 110 would also be increased in size. However, there is a limit to producing a large back cover formed as a single body due to the nature of the manufacturing process. The back cover 110 may be manufactured to include the openings 111 by etching a metal plate. In this case, it is not easy to manufacture a single metal plate that corresponds in size to the back cover 110 having a predetermined size or larger. Also, it is not easy to form the openings 111 by etching. Accordingly, in the display device 100 according to an example embodiment of the present disclosure, the back cover 110 may include the first back cover 110a and the second back cover 110b spaced apart from each other. Thus, the display device 100 having a larger size may be more easily manufactured.

<Adhesive Part Including Through-Holes>

Figure 10:
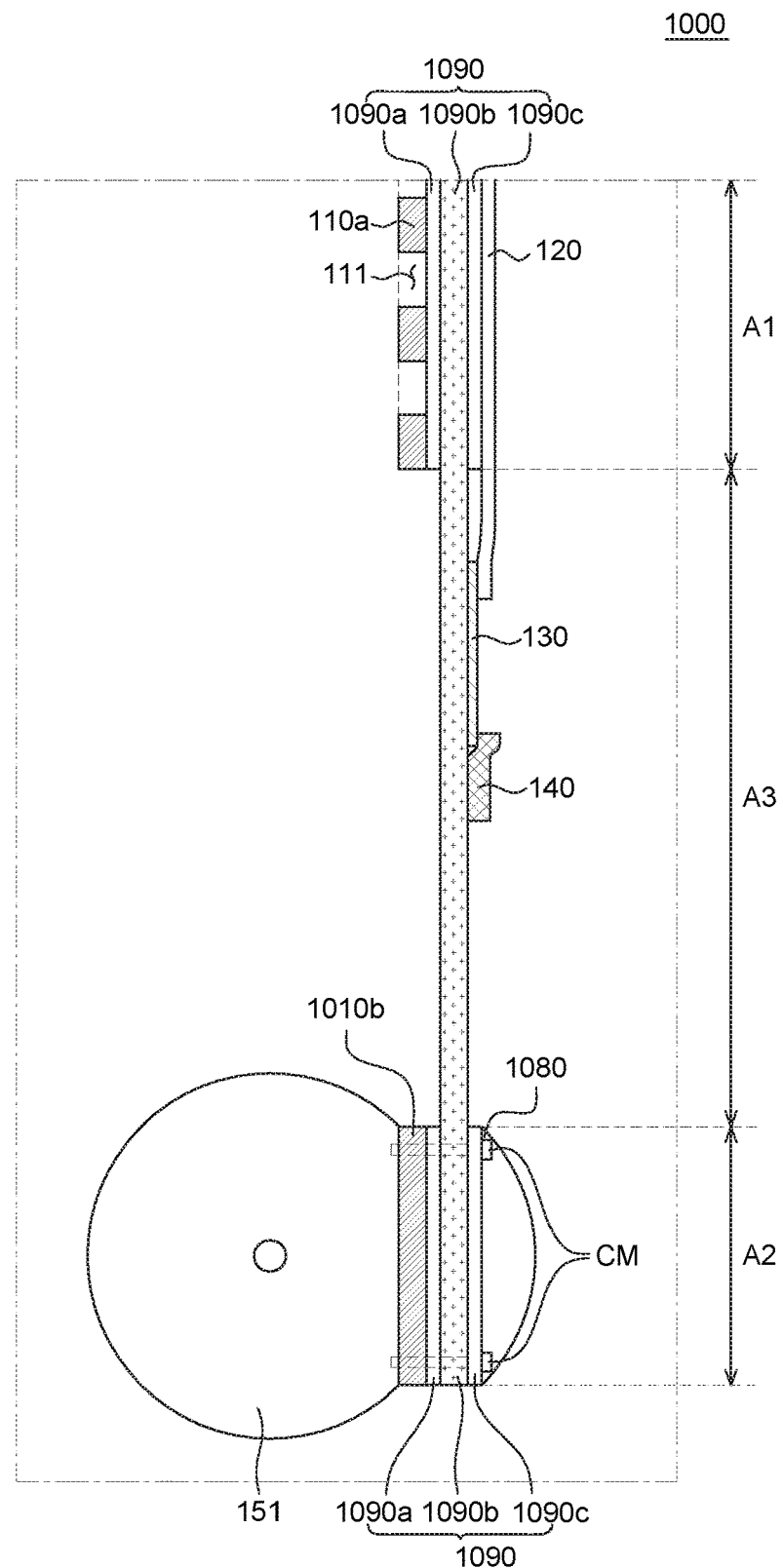
FIG. 10 is a cross-sectional view provided to explain a clamp structure of a display device according to another example embodiment of the present disclosure.
Figure 11:
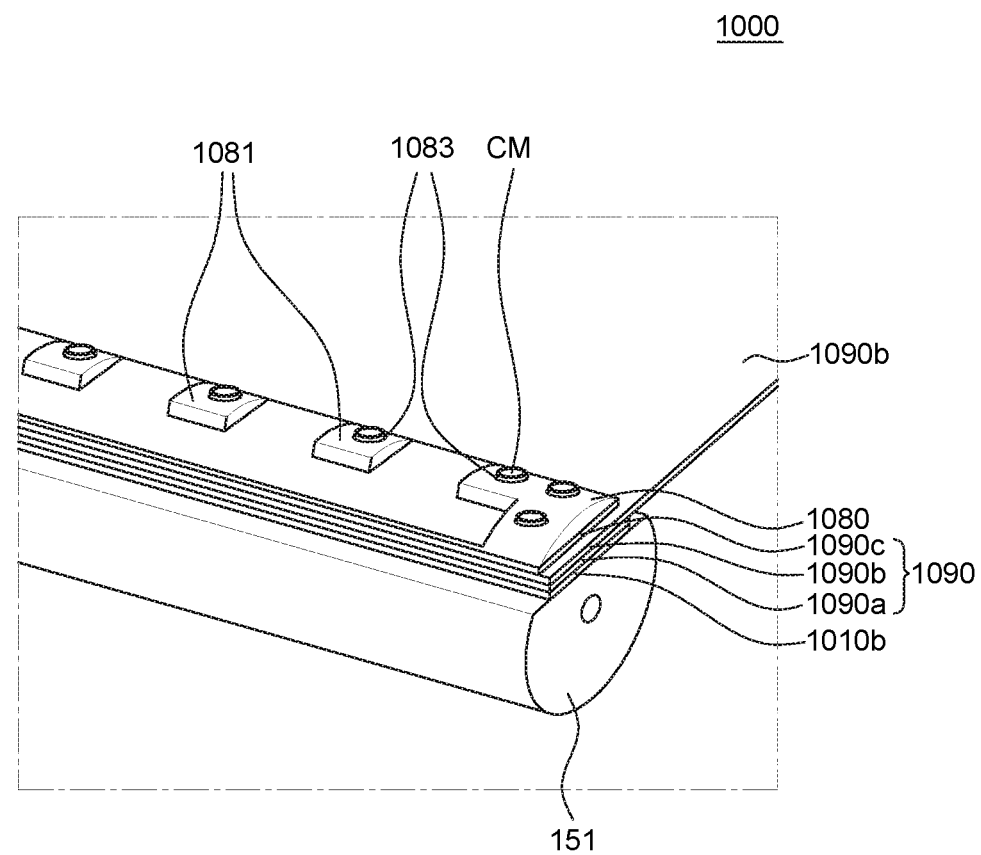
FIG. 11 is a perspective view of the display device according to another example embodiment of the present disclosure.
Figure 12:
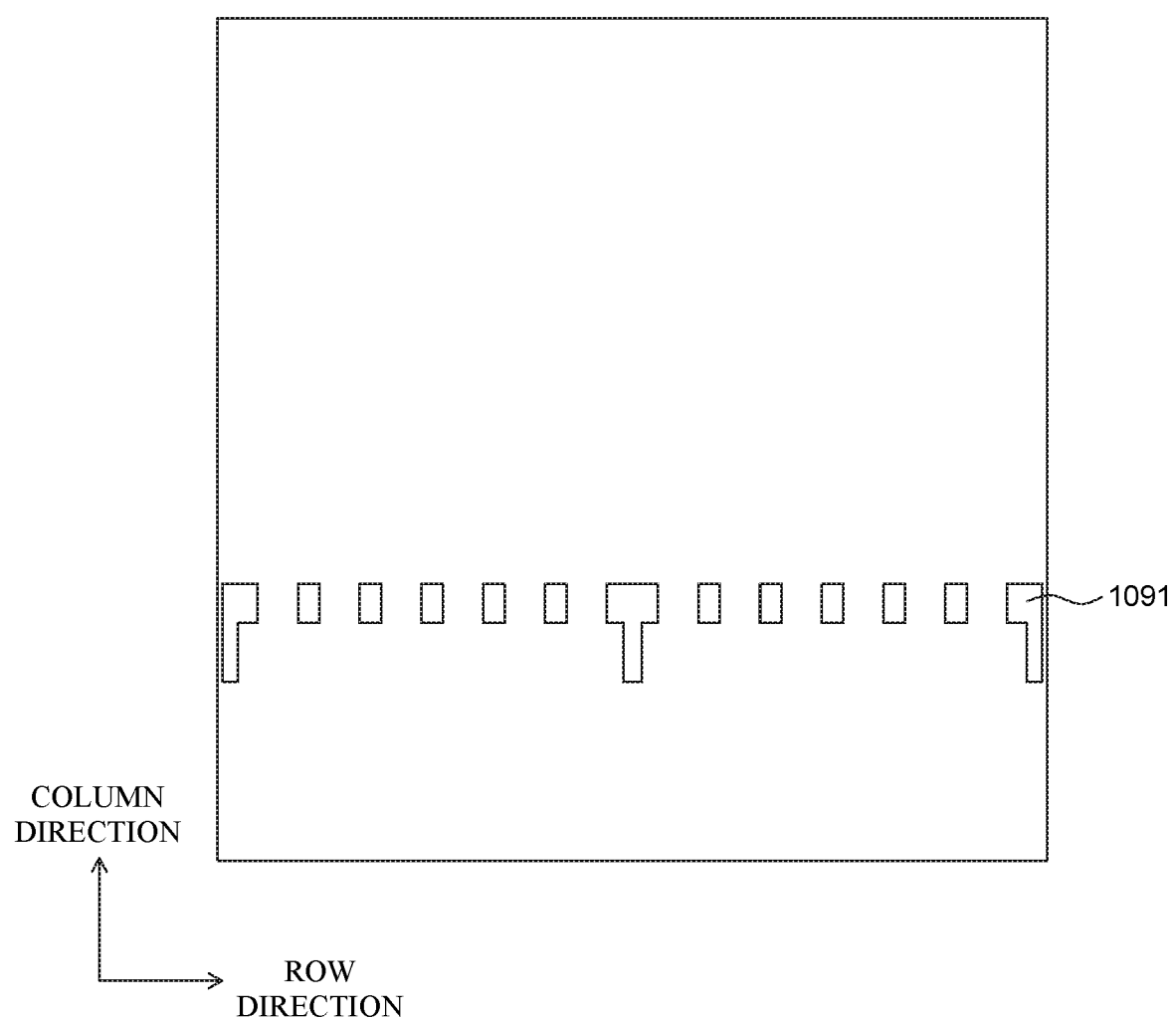
FIG. 12 is a plan view of an adhesive layer of the display device according to another example embodiment of the present disclosure.
Figure 13:
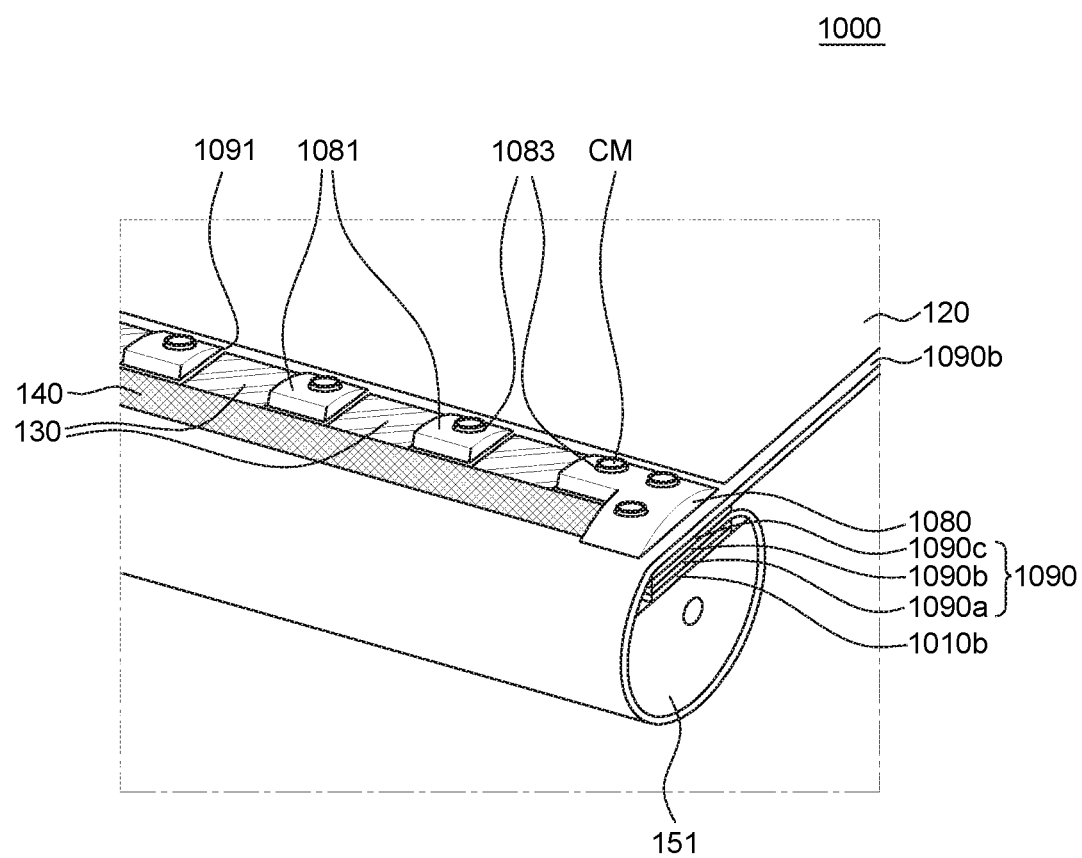
FIG. 13 is a perspective view of the display device according to another example embodiment of the present disclosure.

FIG. 10 is a cross-sectional view provided to explain a clamp structure of a display device according to another example embodiment of the present disclosure. FIG. 11 is a perspective view of the display device according to another example embodiment of the present disclosure. FIG. 12 is a plan view of an adhesive layer of the display device according to another example embodiment of the present disclosure. FIG. 13 is a perspective view of the display device according to another example embodiment of the present disclosure. A display device 1000 illustrated in FIGS. 10 through 13 may have substantially the same configuration as the display device 100 illustrated in FIGS. 1 through 9, except the omission of the base plate 170 and the top cover TC and differences in a back cover 1010, an adhesive part 1090 and a bottom cover 1080. Therefore, redundant description of the same components may not be provided.

As shown in FIG. 10, the back cover 1010 may include the first back cover 110a disposed in the first area A1 of the adhesive part 1090 and a second back cover 1010b disposed in the second area A2 of the adhesive part 1090. In this case, the second back cover 1010b may correspond in size to the flat surface of the roller 151 and may be fixed to the flat surface of the roller 151. Thus, the second back cover 1010b may be fixed to the flat surface of the roller 151 regardless of winding or unwinding. Therefore, the second back cover 1010b may include second fastening holes (for example, AH2 in FIG. 8A) for fastening the plurality of coupling members CM to the roller 151 but may not include openings (for example, 111 in FIG. 8A) for easy winding.

As illustrated in FIG. 10, the adhesive part 1090 may include the first area A1, the second area A2, and the third area A3.

The first area A1 of the adhesive part 1090 may overlap the first back cover 110a and the display panel 120, and adhesive layers 1090a and 1090c may be disposed on the respective sides of the adhesive base film 1090b. That is, in the first area A1, a first adhesive layer 1090a may be disposed on one surface of the adhesive base film 1090b, and the first back cover 110a may be bonded to the first adhesive layer 1090a. Also, a second adhesive layer 1090c may be disposed on the other surface of the adhesive base film 1090b, and the display panel 120 may be bonded to the second adhesive layer 1090c.

In the second area A2 of the adhesive part 1090, the adhesive part 1090 may be fixed to the roller 151, and the adhesive layers 1090a and 1090c may be disposed on the respective surfaces of the adhesive base film 1090b. That is, the first adhesive layer 1090a may be disposed on one surface of the adhesive base film 1090b in the second area A2, and the second back cover 1010b may be bonded to the first adhesive layer 1090a. Also, the second adhesive layer 1090c may be disposed on the other surface of the adhesive base film 1090b, and the bottom cover 1080 may be bonded to the second adhesive layer 1090c. In this case, the roller 151, the second back cover 1010b, the adhesive part 1090, and the bottom cover 1080 may be fixed to the roller 151 by the plurality of coupling members CM. That is, the plurality of coupling members CM may be inserted into a plurality of insertion holes 1083 in protrusions 1081 of the bottom cover 1080 (see, for example, FIG. 11) and may penetrate through-holes in the adhesive part 1090 and the second fastening holes in the second back cover 1010b. Thus, the plurality of coupling members CM may be be fixed to the roller 151. The plurality of coupling members CM may be, e.g., screws, bolts, or the like, but is not limited thereto.

The third area A3 of the adhesive part 1090 may be disposed between the first area A1 and the second area A2. In the third area A3 of the adhesive part 1090, the adhesive base film 1090b may be disposed but not the adhesive layers. That is, in the third area A3, the first adhesive layer 1090a and the second adhesive layer 1090c are not disposed, but the adhesive base film 1090b may be disposed. A portion where the flexible film 130 and the printed circuit board 140 are disposed in the third area A3 may be placed on the flat surface of the roller 151 during winding of the display device 1000. Further, since the adhesive layers 1090a and 1090c are not disposed in the third area A3, the flexible film 130 and the printed circuit board 140 may not be fixed to the adhesive part 1090. However, a separate adhesive material for fixing the flexible film 130 and the printed circuit board 140 may be used in the adhesive base film 1090b of the adhesive part 1090 as needed, depending on the design.

As illustrated in FIG. 10 and FIG. 11, the bottom cover 1080 may be disposed in the second area A2 of the adhesive part 1090. That is, the bottom cover 1080 may be disposed correspondingly to the roller 151 disposed in the second area A2 of the adhesive part 1090. Also, the bottom cover 1080 may be fixed to the roller 151 by the second adhesive layer 1090c of the adhesive part 1090 and the coupling members CM.

As shown in FIG. 11, the adhesive part 1090 and the bottom cover 1080 may be disposed on the flat surface of the roller 151. In this case, the flat surface of the roller 151 may be larger in size than respective surfaces of the adhesive part 1090 and the bottom cover 1080 fixed to the roller 151. Thus, a cross section of the bottom cover 1080 and the roller 151 together may have a generally circular shape with a space at respective side surfaces of the adhesive part 1090 and the bottom cover 1080. However, as long as the cross section of the bottom cover 1080 and the roller 151 together has a substantially circular shape, respective surfaces of the bottom cover 1080 and the first adhesive layer 1090a of the adhesive part 1090 fixed to the roller 151 may be identical in size to or smaller than the flat surface of the roller 151.

As illustrated in FIG. 11, the plurality of protrusions 1081 of the bottom cover 1080 may have a curved outer peripheral surface. The curved surface of the plurality of protrusions 1081 of the bottom cover 1080 may have substantially the same radius of curvature as the roller 151. Specifically, during winding of the display device 1000, the plurality of protrusions 1081 of the bottom cover 1080 may guide the first back cover 110a, the adhesive part 1090, and the display panel 120 to be rolled in a substantially circular shape. Therefore, the plurality of protrusions 1081 of the bottom cover 1080 may have an outer peripheral surface having substantially the same radius of curvature as the roller 151. Thus, during winding of the display device 1000, the bottom cover 1080, the first back cover 110a wound around the bottom cover 1080, the adhesive part 1090, and the display panel 120 may be wound in a substantially circular shape.

As shown in FIG. 12 and FIG. 13, the adhesive part 1090 may further include through-holes 1091. The adhesive part 1090 may be wound on the bottom cover 1080 during winding of the roller unit 150. If the adhesive part 1090 is wound along a top surface of the bottom cover 1080, the flexible film 130 and the printed circuit board 140 on the adhesive part 1090 may also be disposed on the curved surface due to the plurality of protrusions 1081 of the bottom cover 1080. Therefore, the adhesive part 1090 may include the through-holes 1091 positioned correspondingly to the plurality of protrusions 1081 of the bottom cover 1080. Thus, during winding of the roller unit 150, the plurality of protrusions 1081 of the bottom cover 1080 may penetrate the through-holes 1091 in the adhesive part 1090. Accordingly, the adhesive part 1090 can be stably wound on the bottom cover 1080 and also be fixed by the bottom cover 1080.

As illustrated in FIG. 13, when the adhesive part 1090 is wound on the bottom cover 1080, the flexible film 130 and the printed circuit board 140 may also be placed on the bottom cover 1080. Specifically, during winding of the roller unit 150, the plurality of protrusions 1081 may penetrate the through-holes 1091 in the adhesive part 1090. Thus, each flexible film 130 connected to the display panel 120 may be disposed between the plurality of protrusions 1081 of the bottom cover 1080. Also, the printed circuit board 140 connected to the flexible film 130 may be disposed next to the plurality of protrusions 1081 of the bottom cover 1080. Therefore, during winding of the display device 1000, the flexible film 130 and the printed circuit board 140 may be stably positioned on the bottom cover 1080.

Further, if the adhesive part 1090 is wound around the roller 151 one more time, the adhesive part 1090 and the display panel 120 may be wound along the curved outer peripheral surface of the plurality of protrusions 1081 of the bottom cover 1080. Thus, when the adhesive part 1090 and the display panel 120 are wound, a cross section of the adhesive part 1090 and the display panel 120 may have a curved surface, e.g., in a substantially circular shape.

In general, a back cover may include a supporting area fastened to a roller unit and a flexible area extended from the supporting area and may have a larger length than a flat surface of a roller in a direction of winding or unwinding. If the back cover is longer than the flat surface of the roller, a part of the back cover may be would on the interface between the flat surface and a curved surface of the roller during winding of the back cover. Thus, stress may be applied to the back cover. That is, the back cover wound on the interface between the flat surface and the curved surface of the roller may be damaged. Therefore, in the display device 1000 according to another example embodiment of the present disclosure, the second back cover 1010b may have a length corresponding to that of the flat surface of the roller 151. Also, the second back cover 1010b may be configured to be not disposed on the interface between the flat surface and the curved surface of the roller 151 when wound. Therefore, during winding of the second back cover 1010b, stress that may be applied to the second back cover 1010b can be minimized or suppressed.

Further, in the display device 1000 according to another example embodiment of the present disclosure, the second back cover 1010b may have a length corresponding to that of the flat surface of the roller 151. Therefore, during winding of the second back cover 1010b, stress applied to the second back cover 1010b can be minimized or suppressed. That is, the back cover 1010 which is relatively rigid may be disposed only in an area corresponding to the flat surface of the roller 151. Therefore, the size of the back cover 1010 wound around the roller 151 can be reduced. Accordingly, stress applied to the back cover 1010, particularly the second back cover 1010b, can be reduced.

In addition, in the display device 1000 according to another example embodiment of the present disclosure, during winding of the roller unit 150, the through-holes 1091 of the adhesive part 1090 may be positioned correspondingly to the plurality of protrusions 1081 of the bottom cover 1080. Thus, the adhesive part 1090 and the flexible film 130 and printed circuit board 140 supported on the adhesive part 1090 may be stably positioned on the bottom cover 1080. Specifically, during winding of the roller unit 150, the adhesive part 1090 may be wound along the top surface of the bottom cover 1080. In this case, the flexible film 130 and the printed circuit board 140 on the adhesive part 1090 may also be disposed on the curved surface. Therefore, the flexible film 130 and the printed circuit board 140 may be damaged by repeated winding and unwinding of the display device 1000. Accordingly, the through-holes 1091 may be provided in the adhesive part 1090. Thus, the plurality of protrusions 1081 of the bottom cover 1080 may penetrate the through-holes 1091, and the adhesive part 1090 may be positioned on the bottom cover 1080. Therefore, the flexible film 130 and the printed circuit board 140 on the adhesive part 1090 may be positioned on the bottom cover 1080. That is, during winding of the roller unit 150, each flexible film 130 connected to the display panel 120 may be disposed between the plurality of protrusions 1081 and the printed circuit board 140 connected to the flexible film 130 may be disposed next to the plurality of protrusions 1081. Thus, the flexible film 130 and the printed circuit board 140 may be stably positioned and held on the bottom cover 1080. Therefore, potential damages to the flexible film 130 and the printed circuit board 140 due to floating can be minimized or suppressed.

Also, in the display device 1000 according to another example embodiment of the present disclosure, the rollability of the display device 1000 may be improved using a single additional structure. That is, during winding of the display device 1000, the bottom cover 1080 may be used as the only additional structure to be disposed on the flat surface of the roller 151 and configured to fix the flexible film 130 and the printed circuit board 140. Thus, in the display device 1000 according to another example embodiment of the present disclosure, there is no need to use any structure other than the bottom cover 1080. Therefore, the configuration of the display device 1000 can be simplified, and the manufacturing process can also be simplified, thereby reducing the manufacturing cost.

<Roller Unit Bonded to Adhesive Part>

Figure 14:
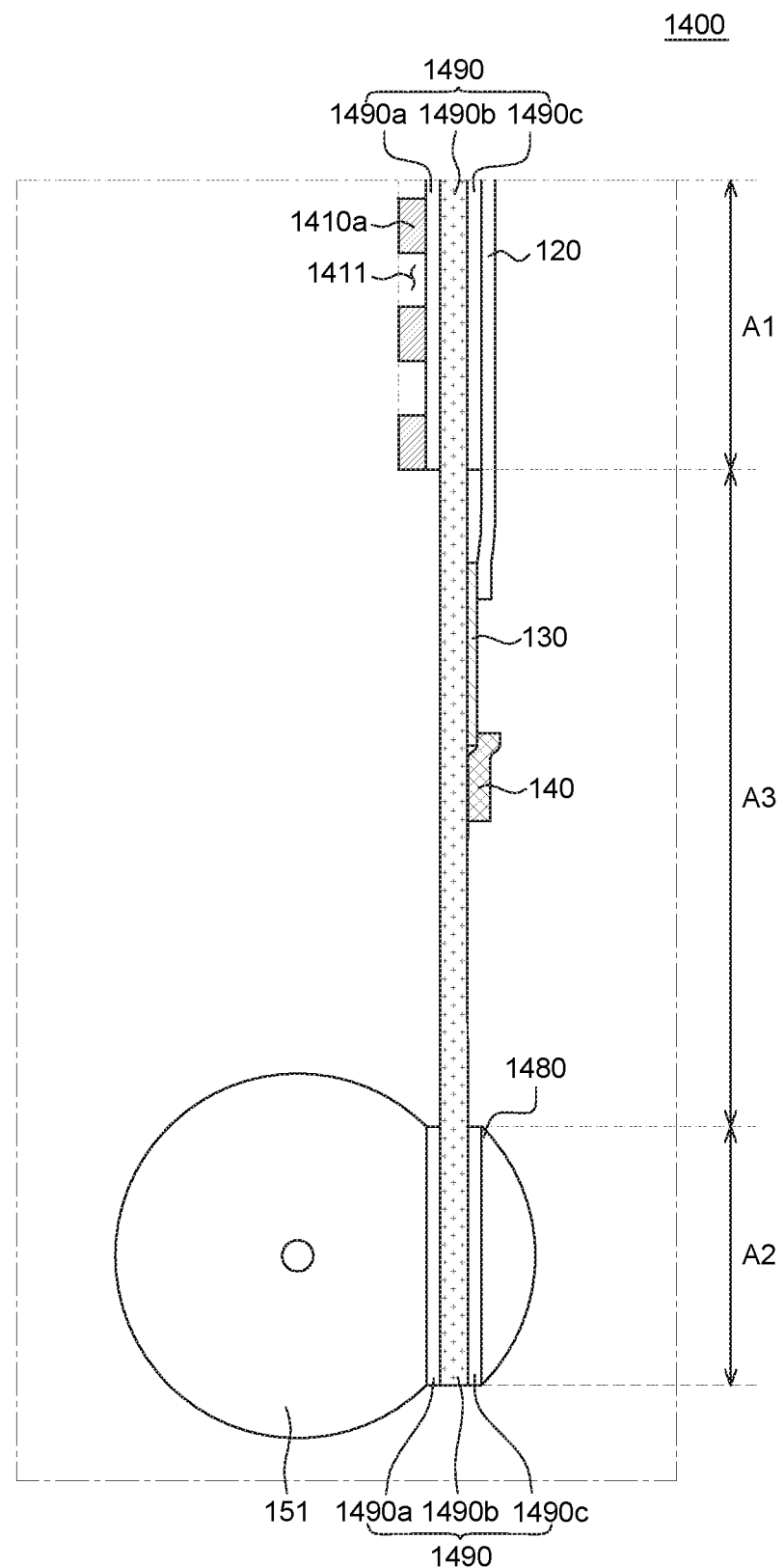
FIG. 14 is a cross-sectional view of a display device according to yet another embodiment of the present disclosure.

FIG. 14 is a perspective view of a display device according to yet another example embodiment of the present disclosure. A display device 1400 illustrated in FIG. 14 may have substantially the same configuration as the display device 1000 illustrated in FIGS. 10 through 13, except the omission of the coupling members CM and differences in a back cover 1410, an adhesive part 1490, and a bottom cover 1480. Therefore, redundant description of the same components may not be provided.

As shown in FIG. 14, the back cover 1410a may be configured as a single back cover. That is, the back cover 1410a may overlap the display panel 120 and may be disposed only in the first area A1 of the adhesive part 1490 but may not be fixed to the roller 151. Further, the back cover 1410a may include a plurality of openings 1411, similar to the openings 111 described above with reference to, e.g., FIGS. 8A and 8B. That is, the back cover 1410a illustrated in FIG. 14 may be substantially the same as the first back cover 110a illustrated in FIGS. 5, 6, 8A, 9 and 10. Also, the plurality of openings 1411 illustrated in FIG. 14 may be substantially the same as the plurality of openings 111 illustrated in FIGS. 6 through 10.

As illustrated in FIG. 14, the roller 151 may be bonded directly to the adhesive part 1490. Specifically, the back cover 1410a may not be disposed between the roller 151 and the adhesive part 1490, and the roller 151 may be bonded directly to a first adhesive layer 1490a disposed in the second area A2 of the adhesive part 1490.

Further, the bottom cover 1480 may be bonded directly to the adhesive part 1490. Specifically, the bottom cover 1480 may be bonded directly to a second adhesive layer 1490c disposed in the second area A2 of the adhesive part 1490.

In this case, the adhesive layers 1490a and 1490c of the adhesive part 1490 may have a sufficient adhesive strength to fix the bottom cover 1480 and the roller 151 without separate coupling members CM. That is, as shown in FIG. 14, in the display device 1400 according to yet another example embodiment of the present disclosure, insertion holes for insertion of a plurality of coupling members need not be provided in the bottom cover 1480. Also, holes corresponding to the insertion holes need not be disposed in an adhesive base film 1490b and the adhesive layers 1490a and 1490c of the adhesive part 1490. Therefore, the roller 151 and the bottom cover 1480 can be fixed with the adhesive layers 1490a and 1490c of the adhesive part 1490 without the use of a plurality of coupling members. That is, the adhesive layers 1490a and 1490c have a sufficiently strong adhesive strength to fix the bottom cover 1480 and the roller 151 securely without the use of separate coupling members.

In the display device 1400 according to yet another example embodiment of the present disclosure, the roller 151 may be bonded directly to the adhesive part 1490, and the bottom cover 1480 may be bonded directly to the adhesive part 1490. Also, the adhesive layers 1490a and 1490c of the adhesive part 1490 may have a strong adhesive strength. Thus, separate fastening members, such as coupling members, for fixing the roller 151, the adhesive part 1490, and the bottom cover 1480 may not be needed. Therefore, in the display device 1400 according to yet another example embodiment of the present disclosure, there is no need to use separate fastening members for fixing the roller 151, the adhesive part 1490, and the bottom cover 1480. Accordingly, the configuration of the display device 1400 can be simplified, and the manufacturing cost can be reduced. Also, there is no need to perform a process for fastening separate members for fixing the roller 151, the adhesive part 1490, and the bottom cover 1480. Further, there is no need to perform a process for forming holes for fastening separate members to the roller 151, the adhesive part 1490, and the bottom cover 1480. Therefore, a process for manufacturing the display device 1400 may be simplified.

Various example embodiments of the present disclosure may also be described as follows:

A display apparatus may include a display panel configured to display an image; a first back cover at a rear surface of the display panel and supporting the display panel; a roller configured to wind or unwind the display panel; and an adhesive part between the display panel and the first back cover, and fixed to the roller.

The display apparatus may further include a printed circuit board electrically connected to the display panel and fixed to the adhesive part. The adhesive part may be attached to the display panel and the first back cover.

The display apparatus may further include a bottom cover fixed to the roller and including at least one protrusion having a curved outer peripheral surface and an insertion hole.

The adhesive part may include at least one through-hole configured to accommodate the at least one protrusion of the bottom cover during winding of the display panel.

The display apparatus may further include a second back cover. The adhesive part may include an adhesive base film overlapping the first back cover and the second back cover and connecting the first back cover and the second back cover, and at least one adhesive layer on the adhesive base film, and overlapping at least one of the first back cover and the second back cover.

The adhesive part may have a first area overlapping the display panel and the first back cover, a second area fixed to the roller, and a third area connecting the first area and the second area. The adhesive part may include an adhesive base film in the first, second, and third areas, and at least one adhesive layer on the adhesive base film in the first and second areas.

The display apparatus may further include a bottom cover fixed to the roller. The adhesive part may include the at least one adhesive layer on both surfaces of the adhesive base film in the second area.

The display apparatus may further include a bottom cover fixed to the roller and including at least one protrusion having an insertion hole and a curved outer peripheral surface; and at least one coupling member penetrating the insertion hole of the at least one protrusion to fix the bottom cover to the roller.

The display apparatus may further include a second back cover fixed to the roller. The adhesive part may connect the first back cover and the second back cover.

The adhesive part may include an adhesive base film between the display panel and the first back cover; and a first adhesive layer between the adhesive base film and the first back cover, and attached to the first back cover.

The first adhesive layer of the adhesive part may include a first section between the adhesive base film and the first back cover, and attached to the first back cover; and a second section spaced apart from the first section, disposed between the adhesive base film and the roller, and fixed to the roller.

The display apparatus may further include a second back cover spaced apart from the first back cover, and connected between the roller and the second section of the first adhesive layer; and at least one coupling member to fasten the adhesive part, the second back cover, and the roller to one another.

The display apparatus may further include a bottom cover fixed to the roller. The roller may have a flat surface to which the bottom cover is fixed, and the adhesive part may be connected between the bottom cover and the flat surface of the roller.

The adhesive part may include an adhesive base film between the bottom cover and the flat surface of the roller; a first adhesive layer between the adhesive base film and the flat surface of the roller; and a second adhesive layer between the adhesive base film and the bottom cover.

The bottom cover may have a plurality of protrusions, and the adhesive part may have a plurality of through-holes configured to accommodate the plurality of protrusions of the bottom cover while the adhesive part is wound around the roller at least once.

The display apparatus may further include a plurality of flexible films connected to the display panel, and disposed on the adhesive part between the through-holes; and at least one printed circuit board connected to the plurality of flexible films and disposed on the adhesive part adjacent to the through holes. With the adhesive part wound around the roller at least once, the plurality of flexible films may be configured to be positioned between the plurality of protrusions of the bottom cover, and the at least one printed circuit board may be configured to be positioned adjacent to the plurality of protrusions.

The roller may further include a curved surface connected to the flat surface. The bottom cover may include a curved outer surface having a substantially same radius of curvature as the curved surface of the roller.

A display apparatus may include a display panel configured to display an image; a first back cover at a rear surface of the display panel and supporting the display panel; a second back cover spaced apart from the first back cover; an adhesive part connected between the display panel and the first back cover, and connected to the second back cover; and a roller connected to the second back cover, and configured to wind or unwind at least one of the adhesive part, the display panel, and the first back cover.

The display apparatus may further include a base plate between the first back cover and the second back cover, and fixed to the adhesive part at a first surface of the adhesive part; and a bottom cover fixed to the adhesive part at a second surface of the adhesive part opposite the first surface.

The display apparatus may further include at least one flexible film on the bottom cover and connected to the display panel; at least one printed circuit board on the bottom cover and connected to the at least one flexible film; and a top cover covering the at least one flexible film and the at least one printed circuit board. The base plate may have a plurality of fixing protrusions configured to penetrate holes in the adhesive part, the bottom cover, and the top cover to fasten the base plate, the adhesive part, the bottom cover, and the top cover to one another.

The second back cover may include a supporting area fixed to the roller and a flexible area extending from the supporting area toward the first back cover.

The roller may have a flat surface and a curved surface, and a distance between the first back cover and the second back cover may be equal to or larger than a length of the flat surface of the roller.

The adhesive part may include a first area overlapping the display panel and the first back cover; a second area overlapping the second back cover; and a third area connecting the first area and the second area, the third area of the adhesive part overlapping neither the first back cover nor the second back cover.

The first area of the adhesive part may include an adhesive base film; a first adhesive layer attached between the adhesive base film and the first back cover; and a second adhesive layer attached between the adhesive base film and the display panel.

The adhesive base film may be in both the first area and the second area of the adhesive part. The first adhesive layer may include a first section between the adhesive base film and the first back cover in the first area, and a second section spaced apart from the first section and fixed between the adhesive base film and the second back cover in the second area.

The display apparatus may further include at least one coupling member fastening the adhesive part, the second back cover, and the roller to one another.

Although the example embodiments of the present disclosure are described above in detail with reference to the accompanying drawings, the present disclosure is not limited thereto and may be embodied in many different forms without departing from the technical concept of the present disclosure. Therefore, the example embodiments of the present disclosure are provided for illustrative purposes only and are not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following appended claims, and all the technical concepts in the equivalent scope thereof should be construed as falling within the scope of the present disclosure.

It will be apparent to those skilled in the art that various modifications and variations can be made in the display device of the present disclosure without departing from the spirit or scope of the disclosure. Thus, it is intended that the present disclosure cover the modifications and variations of this disclosure provided they come within the scope of the appended claims and their equivalents.

What is claimed is:

1. A display apparatus, comprising:
a display panel configured to display an image;
a first back cover at a rear surface of the display panel and supporting the display panel;
a roller configured to wind or unwind the display panel;
an adhesive part between the display panel and the first back cover, and fixed to the roller; and
a bottom cover fixed to the roller,
wherein the roller has a flat surface to which the bottom cover is fixed, and the adhesive part is connected between the bottom cover and the flat surface of the roller,
wherein the bottom cover has a plurality of protrusions, at least one of the protrusions having a curved outer peripheral surface, and
wherein the adhesive part has a plurality of through-holes configured to accommodate the plurality of protrusions of the bottom cover with the adhesive part wound around the roller at least once.

2. The display apparatus of claim 1, further comprising:
a printed circuit board electrically connected to the display panel and fixed to the adhesive part,
wherein the adhesive part is attached to the display panel and the first back cover.

3. The display apparatus of claim 1,
wherein the at least one of the protrusions has an insertion hole.

4. The display apparatus of claim 3, further comprising:
at least one coupling member penetrating the insertion hole of the at least one of the protrusions to fix the bottom cover to the roller.

5. The display apparatus of claim 1, further comprising a second back cover, wherein the adhesive part includes:

an adhesive base film overlapping the first back cover and the second back cover, and connecting the first back cover and the second back cover, and at least one adhesive layer on the adhesive base film, and overlapping at least one of the first back cover and the second back cover.

6. The display apparatus of claim 1, wherein the adhesive part has:

a first area overlapping the display panel and the first back cover;

a second area fixed to the roller; and a third area connecting the first area and the second area, wherein the adhesive part includes an adhesive base film in the first, second, and third areas, and at least one adhesive layer on the adhesive base film in the first and second areas.

7. The display apparatus of claim 6, wherein the adhesive part includes the at least one adhesive layer on both surfaces of the adhesive base film in the second area.

8. The display apparatus of claim 1, further comprising:

a second back cover fixed to the roller, wherein the adhesive part connects the first back cover and the second back cover.

9. The display apparatus of claim 1, wherein the adhesive part includes:

an adhesive base film between the display panel and the first back cover; and a first adhesive layer between the adhesive base film and the first back cover, and attached to the first back cover.

10. The display apparatus of claim 9, wherein the first adhesive layer of the adhesive part includes:

a first section between the adhesive base film and the first back cover, and attached to the first back cover; and a second section spaced apart from the first section, disposed between the adhesive base film and the roller, and fixed to the roller.

11. The display apparatus of claim 10, further comprising:

a second back cover spaced apart from the first back cover, and connected between the roller and the second section of the first adhesive layer; and at least one coupling member to fasten the adhesive part, the second back cover, and the roller to one another.

12. The display apparatus of claim 1, wherein the adhesive part includes:

an adhesive base film between the bottom cover and the flat surface of the roller;

a first adhesive layer between the adhesive base film and the flat surface of the roller; and a second adhesive layer between the adhesive base film and the bottom cover.

13. The display apparatus of claim 1, further comprising:

a plurality of flexible films connected to the display panel, and disposed on the adhesive part between the through-holes; and at least one printed circuit board connected to the plurality of flexible films and disposed on the adhesive part adjacent to the through holes, wherein with the adhesive part wound around the roller at least once, the plurality of flexible films is configured to be positioned between the plurality of protrusions of the bottom cover, and the at least one printed circuit board is configured to be positioned adjacent to the plurality of protrusions.

14. The display apparatus of claim 1, wherein the roller further includes a curved surface connected to the flat surface, and wherein the curved outer surface of the at least one of the protrusions has a same radius of curvature as the curved surface of the roller.

15. A display apparatus, comprising:

a display panel configured to display an image;

a first back cover at a rear surface of the display panel and supporting the display panel;

a second back cover spaced apart from the first back cover;

an adhesive part connected between the display panel and the first back cover, and connected to the second back cover;

a roller connected to the second back cover, and configured to wind or unwind at least one of the adhesive part, the display panel, and the first back cover; and a bottom cover fixed to the roller, wherein the roller has a flat surface to which the bottom cover is fixed, and the adhesive part is connected between the bottom cover and the flat surface of the roller, wherein the bottom cover has a plurality of protrusions, at least one of the protrusions having a curved outer peripheral surface, and wherein the adhesive part has a plurality of through-holes configured to accommodate the plurality of protrusions of the bottom cover with the adhesive part wound around the roller at least once.

16. The display apparatus of claim 15, further comprising:

a base plate between the first back cover and the second back cover, and fixed to the adhesive part at a first surface of the adhesive part;

wherein the bottom cover is fixed to the adhesive part at a second surface of the adhesive part opposite the first surface.

17. The display apparatus of claim 16, further comprising:

at least one flexible film on the bottom cover and connected to the display panel;

at least one printed circuit board on the bottom cover and connected to the at least one flexible film; and a top cover covering the at least one flexible film and the at least one printed circuit board, wherein the base plate has a plurality of fixing protrusions configured to penetrate holes in the adhesive part, the bottom cover, and the top cover to fasten the base plate, the adhesive part, the bottom cover, and the top cover to one another.

18. The display apparatus of claim 15, wherein the second back cover includes:

a supporting area fixed to the roller; and a flexible area extending from the supporting area toward the first back cover.

19. The display apparatus of claim 15, wherein the roller further includes a curved surface, and a distance between the first back cover and the second back cover is equal to or larger than a length of the flat surface of the roller.

20. The display apparatus of claim 15, wherein the adhesive part includes:

a first area overlapping the display panel and the first back cover;

a second area overlapping the second back cover; and a third area connecting the first area and the second area, the third area of the adhesive part overlapping neither the first back cover nor the second back cover.

21. The display apparatus of claim 20, wherein the first area of the adhesive part includes:

an adhesive base film;

a first adhesive layer attached between the adhesive base film and the first back cover; and a second adhesive layer attached between the adhesive base film and the display panel.

22. The display apparatus of claim 21, wherein the adhesive base film is in both the first area and the second area of the adhesive part, and wherein the first adhesive layer includes:
a first section between the adhesive base film and the first back cover in the first area, and
a second section spaced apart from the first section and fixed between the adhesive base film and the second back cover in the second area.

23. The display apparatus of claim 22, further comprising:
at least one coupling member fastening the adhesive part, the second back cover, and the roller to one another.

\* \* \* \* \*